US010352969B2

(12) United States Patent
Milano et al.

(10) Patent No.: US 10,352,969 B2
(45) Date of Patent: Jul. 16, 2019

(54) SYSTEMS AND METHODS FOR INTEGRATED SHIELDING IN A CURRENT SENSOR

(71) Applicant: Allegro MicroSystems, LLC, Manchester, NH (US)

(72) Inventors: Shaun D. Milano, Dunbarton, NH (US); Bryan Cadugan, Bedford, NH (US); Michael C. Doogue, Bedford, NH (US); Alexander Latham, Harvard, MA (US); William P. Taylor, Amherst, NH (US); Harianto Wong, Southborough, MA (US); Sundar Chetlur, Bedford, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 279 days.

(21) Appl. No.: 15/363,285

(22) Filed: Nov. 29, 2016

(65) Prior Publication Data

US 2018/0149677 A1    May 31, 2018

(51) Int. Cl.
G01R 15/14    (2006.01)
G01R 19/00    (2006.01)
G01R 15/20    (2006.01)

(52) U.S. Cl.
CPC ......... *G01R 15/148* (2013.01); *G01R 15/207* (2013.01); *G01R 19/0092* (2013.01); *G01R 15/202* (2013.01); *G01R 15/205* (2013.01); *H01L 2224/16145* (2013.01); *H01L 2224/48091* (2013.01); *H01L 2224/48247* (2013.01);

(Continued)

(58) Field of Classification Search
None
See application file for complete search history.

(56) References Cited

U.S. PATENT DOCUMENTS

| 5,041,780 A | 8/1991 | Rippel |
| 6,819,095 B1 | 11/2004 | Dubhashi et al. |
| 7,598,601 B2 | 10/2009 | Taylor et al. |

(Continued)

FOREIGN PATENT DOCUMENTS

| EP | 0042165 | 12/1981 |
| EP | 2295993 | 3/2011 |
| WO | WO 2016/164265 | 10/2016 |

OTHER PUBLICATIONS

Extended European Search Report dated Apr. 13, 2018 for EP Application No. EP 17203672.5; 8 pages.

(Continued)

*Primary Examiner* — Melissa J Koval
*Assistant Examiner* — Nasima Monsur
(74) *Attorney, Agent, or Firm* — Daly, Crowley, Mofford & Durkee, LLP

(57) ABSTRACT

Systems and methods described herein are directed towards integrating a shield layer into a current sensor to shield a magnetic field sensing element and associated circuitry in the current sensor from electrical, voltage, or electrical transient noise. In an embodiment, a shield layer may be disposed along at least one surface of a die supporting a magnetic field sensing element. The shield layer may be disposed in various arrangements to shunt noise caused by a parasitic coupling between the magnetic field sensing element and the current carrying conductor away from the magnetic field sensing element.

19 Claims, 10 Drawing Sheets

(52) U.S. Cl.
CPC ............... *H01L 2224/48465* (2013.01); *H01L 2224/73265* (2013.01)

(56) References Cited

U.S. PATENT DOCUMENTS

| | | |
|---|---|---|
| 8,080,994 B2 | 12/2011 | Taylor et al. |
| 8,717,016 B2* | 5/2014 | Ausserlechner ..... G01R 15/202 |
| | | 324/251 |
| 2004/0135220 A1* | 7/2004 | Goto ....................... H01L 27/22 |
| | | 257/427 |
| 2006/0219436 A1 | 10/2006 | Taylor et al. |
| 2007/0170533 A1* | 7/2007 | Doogue ................. B82Y 25/00 |
| | | 257/422 |
| 2007/0279053 A1 | 12/2007 | Taylor et al. |
| 2008/0297138 A1* | 12/2008 | Taylor .................... H01L 24/37 |
| | | 324/117 H |
| 2009/0243074 A1* | 10/2009 | Ramiah ............... H01L 21/3065 |
| | | 257/686 |
| 2010/0156394 A1 | 6/2010 | Ausserlechner et al. |
| 2010/0207258 A1* | 8/2010 | Eun ....................... H01L 23/055 |
| | | 257/660 |
| 2012/0049304 A1 | 3/2012 | Motz et al. |

OTHER PUBLICATIONS

Response to Search Opinion filed on Nov. 30, 2018 for European Application No. 17203672.5; 20 Pages.

\* cited by examiner

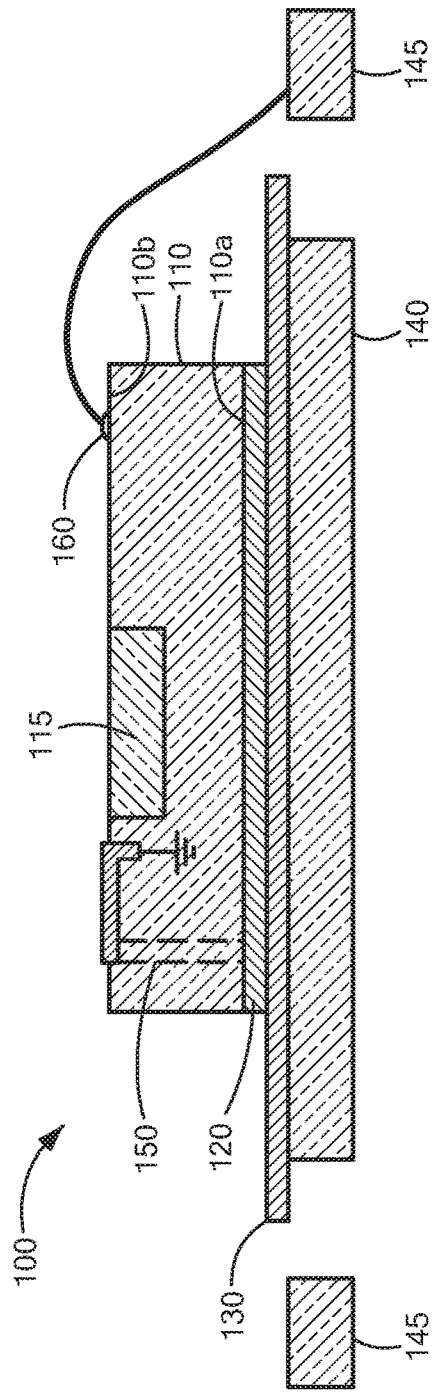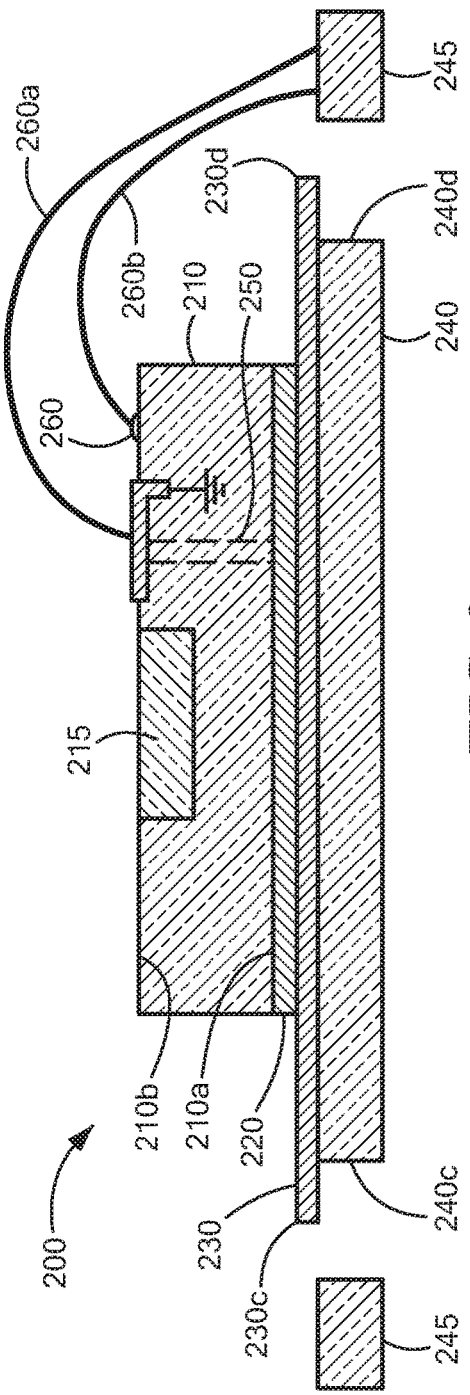

SYSTEMS AND METHODS FOR INTEGRATED SHIELDING IN A CURRENT SENSOR

BACKGROUND

As is known in the art, some current sensors use a magnetic field sensing element in proximity to a current conductor. The sensing element can generate an output signal having a magnitude proportional to the magnetic field induced by a current that flows through the current conductor.

Various parameters characterize the performance of current sensors, including sensitivity. Sensitivity is related to the magnitude of a change in output voltage from the sensing element in response to a sensed current. The sensitivity of a current sensor can be influenced by a variety of factors, including is a physical distance between the sensing element and the conductor.

Integration of the current sensor, including the sensing element and the conductor into an integrated circuit (IC) package calls for close and precise positioning of the current conductor relative to the sensing element. Thus, voltage noise that is capacitively coupled from the current conductor can adversely impact the performance and output of the sensing element and the current sensor causing an unwanted or inaccurate response.

SUMMARY

Systems and methods described herein are directed towards integrating a shield layer into a current sensor. In an embodiment, noise from external sources and internal sources, such as between different components of the current sensor, can impact the output and performance of the current sensor. For example, in a current sensor, having a die supporting a magnetic field sensing element and associated circuitry and a current carrying conductor (e.g. lead frame), the die and the current carrying conductor can form two plates of a parasitic capacitor. This capacitance can lead to the coupling of electrical, voltage, or electrical transient noise from the conductor to the die during large transient (dV/dt) events on the conductor. In an embodiment, the shield layer can be disposed in various arrangements between the die and the conductor to shunt this noise to ground, for example, when one plate of the capacitor is tied to ground through the shield layer.

In an embodiment, the shield layer may be disposed along at least one surface of a die supporting a magnetic field sensing element to shield the magnetic field sensing element and associated circuitry from external noise and internal noise, such as may be capacitively coupled from a current carrying conductor in the current sensor. In an embodiment, the shield layer may be disposed in various arrangements to reduce the effect of parasitic coupling between the magnetic field sensing element and the current carrying conductor. In some embodiments, having a die up configuration, a shield layer may be disposed along a back side of the die and proximal to the current carrying conductor.

In other embodiments, such as those having a flip chip configuration, a shield layer may be disposed on a surface of the die supporting the magnetic field sensing element proximate to the current carrying conductor. The shield layer may include an aperture (or other features to enable high frequency magnetic fields to reach the sensing element) to reduce eddy currents. In some embodiments having a dual die assembly, a first die may be disposed between the current carrying conductor and a second die supporting the magnetic field sensing element. The first die may include shield and insulation layers to reduce a noise experienced by the magnetic field sensing element and circuitry.

The shield layer can be integrated into the current sensor using various techniques, including but not limited to, through hole silicon vias, stacked die arrangements, and/or wafer bonding, and be configured to prevent coupling noise onto the die during high transient (dV/dt) events in the current carrying conductor.

In a first aspect, the present disclosure is directed towards a current sensor having a conductor, an insulation layer in contact the conductor, a semiconductor substrate having a shield layer disposed on a first surface proximal to the insulation layer and a second opposing surface distal from the insulation layer and a via extending through the semiconductor substrate to couple the shield layer to the second surface of the semiconductor substrate. In some embodiments, the shield layer can be coupled to a reference potential through the via.

In an embodiment, the current sensor can be provided in the form of an integrated circuit having a lead frame. The conductor may comprise a first portion of the lead frame and a plurality of signal leads may comprise a second portion of the lead frame. The current sensor may include an interconnect configured to couple the via to at least one of the plurality of signal leads. In some embodiments, the interconnect may include a wire bond.

In an embodiment, the shield layer can be coupled to a reference potential of a magnetic field sensing circuit supported by the second surface of the semiconductor substrate. The magnetic field sensing circuit may include a magnetic field sensing element comprising at least one of a Hall-effect element or a magnetoresistance element. The insulation layer may include at least one of a polyimide film or a layer of adhesive. The shield layer may include at least one of copper, aluminum or gold, etc.

In some embodiments, the via comprises a through-silicon via extending from the first surface of the semiconductor substrate to the second surface of the semiconductor substrate.

In an embodiment, the first surface of the semiconductor substrate may support a magnetic field sensing circuit. The magnetic field sensing circuit may include a magnetic field sensing element comprising at least one of a Hall-effect element or a magnetoresistance element. The shield layer may include an aperture aligned with the magnetic field sensing element.

In another aspect, the present disclosure is directed towards a current sensor having a conductor and a first die having a first surface proximal to the conductor and a second opposing surface distal from the conductor. The first die may include a shield layer. The current sensor may further include a second die having a first surface proximal to the first die and a second opposing surface distal from the first die and supporting a magnetic field sensing circuit.

In an embodiment, the first die may include a semiconductor substrate having first and second opposing surfaces, a protective layer having a first surface proximal to the second surface of the semiconductor substrate and having a second opposing surface, the shield layer having a first surface proximal to the second surface of the protective layer and having a second opposing surface and a first insulation layer having a first surface proximal to the second surface of the shield layer and having a second opposing surface. In some embodiments, a bond pad may be in contact with the shield layer and exposed through an aperture in the first insulation layer.

In an embodiment, the current sensor may be provided in the form of an integrated circuit having a lead frame. The conductor may comprise a first portion of the lead frame and a plurality of signal leads may comprise a second portion of the lead frame and the current sensor may further comprise a wire bond coupled between the bond pad and at least one of the signal leads.

In some embodiments, the semiconductor substrate may include silicon. The protective layer may include silicon oxide, silicon dioxide, or a combination thereof. The shield layer may include at least one of copper, aluminum or gold. The first insulation layer may include benzo-cyclobutene (BCB).

In some embodiments, the magnetic field sensing circuit may include a magnetic field sensing element comprising at least one of a Hall-effect element or a magnetoresistance element. The first die may include a second insulation layer disposed between the conductor and the semiconductor substrate. In an embodiment, the second insulation layer may include a flex circuit having a layer of Kapton® and a metalized layer. The second insulation layer may include at least one of a polyimide film or a layer of adhesive.

In an embodiment, the first die may be larger than the conductor and have at least one edge that extends beyond an edge of the conductor. The current sensor may be provided in the form of an integrated circuit having a lead frame. The conductor may include a first portion of the lead frame and a plurality of signal leads may include a second portion of the lead frame, and the at least one edge of the first die may extend beyond an edge of at least one of the signal leads. In some embodiments, a first epoxy layer disposed between the conductor and the first surface of the first die and a second epoxy layer disposed between the second surface of the first die and the first surface of the second die.

In another aspect, the present disclosure is directed towards a current sensor having a conductor, an insulation layer in contact with the conductor, a shield layer comprising at least one of a metalized tape or a metalized Mylar® spaced from the conductor by the insulation layer and a semiconductor substrate having a first surface disposed proximal to the shield layer and a second opposing surface disposed distal from the shield layer and supporting a magnetic field sensing element.

The magnetic field sensing element may include at least one of a Hall-effect element or a magnetoresistance element. The current sensor may be provided in the form of an integrated circuit having a lead frame. The conductor may include a first portion of the lead frame and a plurality of signal leads may include a second portion of the lead frame. In some embodiments, the current sensor may include a wire bond configured to couple the shield layer to at least one of the plurality of signal leads.

In an embodiment, the current sensor may include a via extending through the semiconductor substrate to couple the shield layer to the second surface of the semiconductor substrate. The current sensor may include an interconnect configured to couple the via to at least one of the plurality of signal leads.

In some embodiments, the current sensor may include a conductive epoxy disposed between the shield layer and the semiconductor substrate and along at least one side of the semiconductor substrate between the first and second surfaces of the substrate.

In another aspect, the present disclosure is directed towards a current sensor having a first die having a first surface and a second opposing surface supporting a conductor in the form of a coil and a second die having a first surface on which a shield layer is formed and a second opposing surface. The shield layer may include an aperture configured to reduce eddy currents and the shield layer may be spaced from the second surface of the first die by an airgap. The aperture (e.g., cuts, slits, slots or other similar features) may enable high frequency magnetic fields to reach the sensing element.

In some embodiments, the shield layer comprises a first shield layer and the second die may include a protective layer having a first surface proximal to the first shield layer and a second opposing surface, a semiconductor substrate having a first surface proximal to the protective layer and a second opposing surface, and a second shield layer having a first surface proximal to the semiconductor substrate and a second opposing surface.

In an embodiment, the protective layer may support the magnetic field sensing element. The magnetic field sensing element comprises at least one of a Hall-effect element or a magnetoresistance element. The first die may include a third shield layer proximal to the first surface of the first die.

BRIEF DESCRIPTION OF THE DRAWINGS

The foregoing features may be more fully understood from the following description of the drawings in which:

FIG. 1 is a cross section of a current sensor having a die up assembly with a back side die shield layer and a through silicon via;

FIG. 2 is a cross section of a current sensor having a die up assembly, back side die shield layer and a through silicon via with direct bonding;

DETAILED DESCRIPTION

Figure 3:
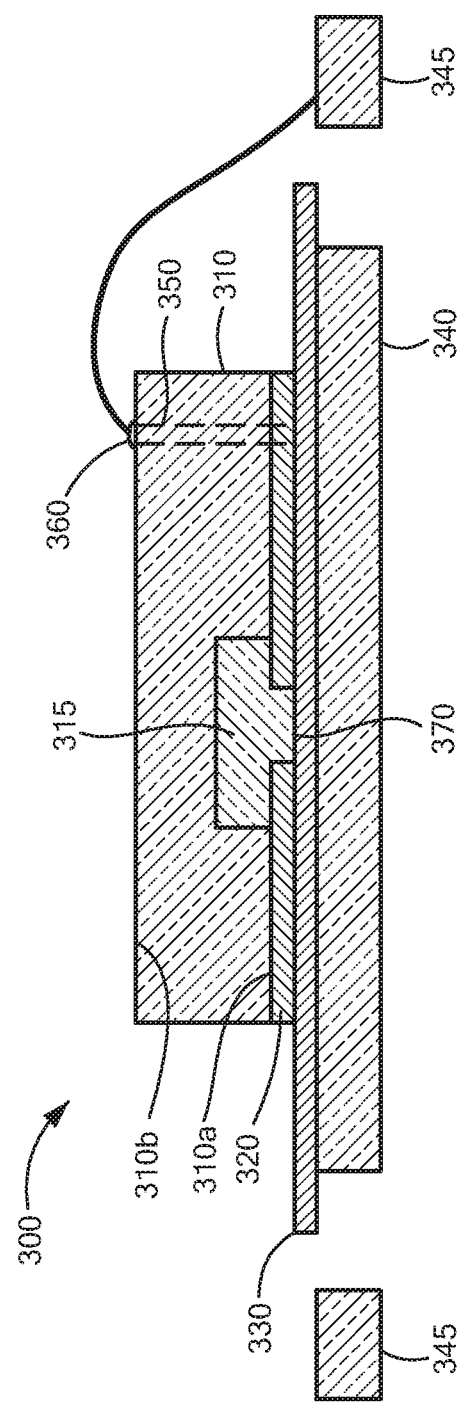
FIG. 3 is a cross section of a current sensor having a die down assembly, a top shield layer, and a through silicon via.

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall-effect element, a magnetoresistance element, or a magnetotransistor. As is known, there are different types of Hall-effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensing circuit" is used to describe a circuit that uses a magnetic field sensing element, generally in combination with other circuits. Magnetic field sensing circuits are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Referring to FIG. 1, a current sensor 100 is provided with a shield layer 120 to reduce the effects of electrical, voltage, or electrical transient noise coupled to active circuitry within the current sensor 100 through parasitic capacitance between a conductor portion and the circuitry. The current sensor 100 includes a conductor 140, an insulation layer 130 in contact with the conductor 140 and a semiconductor substrate 110 having a shield layer 120 disposed on a first surface 110a proximal to the insulation layer 130 and a second opposing surface 110b distal from the insulation layer 130. The current sensor 100 further includes a magnetic field sensing circuit, including a magnetic sensing element 115, supported by the semiconductor substrate 110 and a via 150 extending through the semiconductor substrate 110 to couple the shield layer 120 to the second surface 110b of the semiconductor substrate 110. In an embodiment, the shield layer 120 may be coupled to a reference potential.

In an embodiment, current sensor 100 has a die up configuration. Die up assembly may refer to a current sensor having a magnetic field sensing element 115 and associated circuitry on a surface (here a top surface 110b) of the substrate 110 distal from the current conductor 140. For example, and still referring to FIG. 1, a first surface 110a of the semiconductor substrate 110 is disposed on the shield layer 120 and proximal to the conductor 140. A second surface 110b supports a magnetic field sensing element 115 and is distal from the conductor 140. Thus, the second surface 110b may be referred to as an active surface and the first surface 110a may be referred to as a back surface.

The magnetic field sensing element 115 may be diffused into the second surface 110b or otherwise disposed on or supported by the second surface 110b. While only one magnetic field sensing element 115 is shown, it should be appreciated that more than one magnetic field sensing element 115 may be used in current sensor 100.

The magnetic field sensing element 115 may include a Hall-effect element or magnetoresistance elements. For example, the magnetoresistance elements may include at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element. The magnetoresistance elements can be very sensitive and therefore, in some embodiments, the die up assembly design may be used for current sensors 100 having a magnetoresistance element to create a larger distance between the magnetoresistance element and a current carrying conductor 140.

In some embodiments, during manufacture of the current sensor 100, the magnetoresistance element 115 may be deposited on a silicon layer as part of a final processing step making a top layer metal shield (adjacent to the second active surface 110b), difficult to accomplish without damaging the magnetoresistance element. Thus, the use of the backside shield layer 120 disposed between the semiconductor substrate 110 and the insulation layer 130 (and before the magnetic field sensing element 115), allows for a metal shield layer to be added to the current sensor 100 without damaging the magnetoresistance element.

In an embodiment, the current sensor 100 may be provided as an integrated circuit (IC) having a lead frame. The lead frame may have two portions, a first portion for carrying a primary current to be detected and a second portion for carrying signals to and from the current sensor. For example, the first portion of the lead frame may provide the conductor 140 and the second portion of the lead frame may comprise a plurality of signal leads 145.

The lead frame may be formed from various materials and by various techniques, such as stamping or etching. As one example, the lead frame is a copper lead frame pre-plated with NiPdAu. Other suitable materials for the lead frame include but are not limited to aluminum, copper, copper alloys, titanium, tungsten, chromium, Kovar™, nickel, or alloys of the metals. Furthermore, the lead frame may be comprised of a non-conductive substrate material, such as a standard PC board with FR-4 and copper traces, or a Kapton material with copper or other metal traces (for example a flexible circuit board). The lead and lead frame dimensions can be readily varied to suit particular application requirements.

The substrate 110 may be electrically coupled to at least one signal lead 145 (i.e. lead frame) through an interconnect 160. In some embodiments, the second active surface 110b may be coupled to a signal lead 145 through the interconnect 160. In an embodiment, the interconnect 160 may be a wire bond coupled between a bond pad on the second active surface 110b and the signal lead 145, as shown.

The shield layer 120 can be disposed over or under the first surface 110a (e.g. backside metal shield) of the semiconductor substrate 110. In some embodiments, the shield layer 120 may be applied to or otherwise coated on the first surface 110a of the substrate 110. For example, the shield layer 120 may be plated on the first surface 110a. In other embodiments, the shield layer 120 may be formed on the insulation layer 130 and the substrate 110 attached to the shield layer 120.

In operation, the shield layer 120 which is electrically coupled to a reference potential, serves to tie one plate of undesirable parasitic capacitance between the conductor 140 and substrate 110 to the reference potential. As described herein, a reference potential may refer to a reference voltage including but not limited to a supply voltage (e.g., Vcc), a DC voltage, output voltage or a ground voltage. For example, in one embodiment, the reference potential may couple shield layer 120 to a fixed voltage such that noise is absorbed. The shield layer 120 may include a conductive material, for example and without limitation, aluminum, copper, gold, nickel, aluminum, aluminum copper alloy or other conductive metal material.

The insulation layer 130 can be disposed over a first surface of the conductor 140 and between the shield layer 120 and the conductor 140. In some embodiments, the insulation layer 130 may be applied to a first surface (e.g., top surface) of the conductor 140 as part of a manufacturing process of the current sensor 100. The insulation layer 130 may be applied such that it extends beyond a length of the first surface of the conductor 140. For example, a first and/or second edge of the insulation layer 130 may extend beyond a first and/or second edge (e.g., a length) of the conductor 140, the shield layer 120 or the substrate 110 or a combination of them or all of them.

In an embodiment, the insulation layer 130 may extend beyond a length of the conductor 140, shield layer 120 and/or substrate 110 for creepage and clearance reasons. The term "clearance" refers to the shortest distance through air between two conductive parts such as the primary and secondary leads. The term "creepage" refers to the shortest distance between two conductive parts along the surface of any insulation material common to both parts. The spacing distance between components that are required to withstand a given working voltage may be specified in terms of creepage and clearance. Thus, in some embodiments, to meet a specific standard or need of a particular application of the current sensor 100, the insulation layer 130 may extend beyond a length of the conductor 140, shield layer 120 and/or substrate 110 to meet a clearance and/or creepage requirement and increase a distance between two conductive parts (e.g., conductor 140, substrate 110) of the current sensor 100. The length or distance by which the insulation layer 130 extends beyond a length of the conductor 140, shield layer 120 and/or substrate 110 may vary based on a particular application.

The insulation layer 130 may include a polymer dielectric material. For example, the polymer dielectric material may include a polyimide film, a layer of adhesive material or a combination of polyimide film and adhesive material. In some embodiments, the current sensor 100 may include one or more insulation layers 130. For example, the layer of adhesive material may include a tape material with an additional adhesive layer (e.g., nonconductive epoxy, die attach paste) disposed over it to couple to shield layer 120. The one or more layers of the insulation layer 130 may include different materials. In other embodiments, each of the multiple insulation layers 130 may include the same materials.

In some embodiments, the insulation layer 130 may be formed with a taping process. In other embodiments, the lead frame insulation layer 130 may be formed with a deposition process, such as on the substrate 110. The deposition process used to form the insulation layer 130 can include a variety of processes, including, but not limited to, a screen printing process, a spin depositing process, a sputtering process, a plasma enhanced chemical vapor deposition (PECVD) process, and a low-pressure chemical vapor deposition (LPCVD) process. The screen printing process can result in a substrate insulating layer comprised of a variety of materials, including but not limited to, polymer or ceramic materials. The spin depositing process can result in a substrate insulting layer comprised of a variety of materials, including but not limited to a polymer dielectric film, for example, polyimide (e.g., trade name Pyralin®) or bisbenzocyclobutene (BCB) (e.g., trade name Cyclotene®). The sputtering process can result in the insulting layer 130 comprised of a variety of materials, including but not limited to, nitride or oxide. The PECVD process can result in the insulting layer 130 comprised of a variety of materials, including but not limited to, nitride or oxide. The LPCVD process can result in the insulting layer 130 comprised of a variety of materials, including but not limited to, nitride or oxide.

In an embodiment, the substrate 110 may be mounted or otherwise attached to the conductor 140. The substrate 110 may be mounted after the shield layer 120 has been applied to the first surface 110a of the substrate 110 and after the insulation layer 130 has been applied to the first surface of the conductor 140. Thus, the shield layer 120 can be mounted on or otherwise disposed on the insulation layer 130 and make contact with the insulation layer 130. In an embodiment, the substrate 110 may be separated from the conductor 140 by at least the shield layer 120 and the insulation layer 130.

In an embodiment, to couple the shield layer 120 to a reference potential and/or at least one signal lead 145, a via 150 can be formed in the semiconductor substrate 110. The via 150 may be a through-silicon via and can extend through the semiconductor substrate 110, from the first surface 110a to the second surface 110b. In some embodiments, the via 150 may couple the shield layer 120 to the second surface 110b (i.e. active surface) of the semiconductor substrate 110 and/or to a reference potential of a magnetic field sensing circuit supported by the second substrate surface 110b.

In an embodiment, the via 150 can be coupled to a reference potential, as mat be a reference potential associated with a magnetic field sensing circuit supported by the substrate 110. The via 150 may be coupled to the reference potential to tie a plate of the parasitic capacitance between the substrate 110 and the conductor 140 to the reference potential. Thus, a path may be established to shunt interfering coupling (internal noise) due to high transient events to the reference potential.

Now referring to FIG. 2, a current sensor 200 is provided with a shield layer 220 to reduce the effects of electrical, voltage, or electrical transient noise coupled to the active circuitry of the current sensor 200 through the parasitic capacitance between a conductor portion and the circuitry. The current sensor 200 includes a conductor 240, an insulation layer 230 in contact with the conductor 240 and a semiconductor substrate 210 having a shield layer 220 disposed on a first surface 210a proximal to the insulation layer 230 and a second opposing surface 210b distal from the insulation layer 230. The current sensor 200 further includes a magnetic field sensing circuit, including a magnetic field sensing element 215, supported by the semiconductor substrate 210 and a via 250 extending through the semiconductor substrate 210 to couple the shield layer 220 to the second surface 210b of the semiconductor substrate 210. In an embodiment, the shield layer 220 may be coupled to a reference potential (e.g., a reference voltage, a supply voltage, a DC voltage, ground voltage).

The current sensor 200 may have a die up assembly having the magnetic field sensing element 215 and associated circuitry on a surface (here a top, second surface 210b) of the substrate 210 distal from the current conductor 210. The semiconductor substrate 210 has a first surface 210a disposed proximal to the conductor 240 and a second surface 210b that supports a magnetic field sensing element 215, which is distal from the conductor 240. In some embodiments, the second surface 210b may be referred to as an active surface and the first surface 210b may be referred to as a backside surface.

In an embodiment, the magnetic field sensing element 215 may include a Hall-effect element or a magnetoresistance element. For example, the magnetoresistance elements may include at least one of Indium Antimonide (InSb), a GMR element, an AMR element, a TMR element or a MTJ element.

The magnetic field sensing element 215 may be diffused into the second surface 210b or otherwise disposed on or supported by the second surface 310b. While only one magnetic field sensing element 215 is shown, it should be appreciated that more than one magnetic field sensing element 215 may be used in current sensor 200.

The current sensor 200 may be provided as an IC having a lead frame. The lead frame may have a first portion for carrying a primary current to be detected and a second portion for carrying signals to and from the current sensor 200. The first portion of the lead frame may provide the conductor 240 and the second portion may comprise a plurality of signal leads 245.

The substrate 210 may be electrically coupled to at least one signal lead 245 (i.e., lead frame) through an interconnect 260. In some embodiments, the second active surface 210b may be coupled to a signal lead 245 through the interconnect 260. The interconnect 260 may be a wire bond coupled between a bond pad on the second surface 210b and the signal lead 245. For example, a bond pad may be formed on or disposed on the second surface 210b and connected to the interconnect 260 to couple to signal lead 245.

In the illustrative embodiment of FIG. 2, the shield layer 220 is disposed along the first surface 210a and distal from the magnetic field sensing element 215, thus this assembly may be referred to as back side die shield. The shield layer 220 may be applied to or otherwise coated on the first surface 210a of the substrate 210. For example, the shield layer 220 may be plated to the first surface 210a. In other embodiments, the shield layer 220 may be disposed on the insulation layer 230 and the substrate 210 may be disposed on the shield layer 220.

In operation, the shield layer 220, which is electrically coupled to a reference potential, serves to tie one plate of undesirable parasitic capacitance between the conductor 240 and substrate 210 to the reference potential (e.g., ground). The shield layer 220 may include a conductive material, for example and without limitation, aluminum, copper, gold, nickel, aluminum copper alloy or other conductive metal material.

The shield layer 220 may be coupled to a reference potential of a magnetic field sensing circuit supported by the second surface 210b of the semiconductor substrate 210. For example, the via 250 may extend through the semiconductor substrate 210 to couple the shield layer 220 to the second surface 210b of the semiconductor substrate 210. The via 250 may be formed within the substrate 210. The via 250 may be a through-silicon via and extend from the first surface 210a to the second surface 210b.

In some embodiments, the shield layer 220 can be coupled to the reference potential (e.g., signal lead 245) through the via 250. In an embodiment, the via 250 provides a path for one plate of the parasitic capacitance between the conductor 240 and the substrate 210 to be tied to a ground potential. Thus, a path may be established to shunt interfering coupling due to high transient events to the reference potential.

As indicated above, the current sensor 200 may be similar to the current sensor 100 described above with respect to FIG. 1, however, the current sensor 200 may have direct bonding. For example, a first interconnect 260a may be used to couple the via 250 to at least one signal lead 245 and a second interconnect 260b may be used to couple the second surface 210b of the semiconductor substrate 210 to at least one signal lead 245. In some embodiments, the via 250 and the second surface 210b may be coupled to the same signal lead 245. In other embodiments, the via 250 and the second surface 210b may be coupled to different signal leads 245. Thus separate wires (i.e. interconnects 260a, 260b) may be maintained to a reference potential (i.e. ground plane).

In an embodiment, the insulation layer 230 may be applied or coated to a first surface of the conductor 240. The insulation layer 230 may be disposed on the first surface such that it covers the entire first surface of the conductor 240. In some embodiments, the insulation layer 230 may be larger (e.g. width, length) than the conductor 240. A larger insulation layer 230 may provide further isolation between secondary circuitry including the magnetic field sensing element 215 and the conductor 240. For example, the insulation layer 230 may be larger (e.g. width, length) than the conductor 240 for creepage and clearance reasons. In some embodiments, to meet a specific standard or need of a particular application of the current sensor 200, the insulation layer 230 may extend beyond a length of the conductor 240, shield layer 220 and/or substrate 210 to meet a clearance and/or creepage requirement and increase a distance between two conductive parts (e.g., conductor 240, substrate 210) of the current sensor 200. The length or distance by which the insulation layer 230 extends beyond a length of the conductor 240, shield layer 220 and/or substrate 210 may vary based on a particular application.

For example, the insulation layer 230 may have at least one edge 230c, 230d that that extends beyond an edge 240c, 240d of the conductor 240. In some embodiments, both a first edge 230c of the insulation layer 230 extends beyond a first edge 240c of the conductor 240 and a second edge 230d of the insulation layer 230 extends beyond second edge 240d of the conductor 240. In an embodiment, the extended edges 230c, 230d of the insulation layer 230 may provide further protection (isolation) between secondary and primary sides of the current sensor.

Now referring to FIG. 3, a current sensor 300 is provided with a shield layer 320 to reduce the effects of electrical, voltage, or electrical transient noise coupled to the active circuitry through the parasitic capacitance between a conductor 340 and the circuitry. The current sensor 300 includes a conductor 340, an insulation layer 330 in contact with the conductor 340 and a semiconductor substrate 310 having a shield layer 320 disposed on a first surface 310a proximal to the insulation layer 330 and a second opposing surface 310b distal from the insulation layer 330. The current sensor 300 further includes a magnetic field sensing circuit, including a magnetic field sensing element 315, supported by the semiconductor substrate 310 and a via 350 extending through the semiconductor substrate 310 to couple the shield layer 320 to the second surface 310b of the semiconductor substrate 310. In an embodiment, the shield layer 320 may be coupled to a reference potential (e.g., a reference voltage, a supply voltage, a DC voltage, ground voltage).

In an embodiment, the current sensor 300 may have a die down configuration. A die down configuration refers to a current sensor having a magnetic field sensing element 315 and associated circuitry on a surface (here on a bottom, first surface 310a) of the substrate 310 proximal to the current conductor 340. For example, in the illustrative embodiment of FIG. 3, the semiconductor substrate 310 has a first surface 310a disposed proximal to the conductor 340 and a second surface 310b distal to the conductor 340. The magnetic field sensing element 315 may be disposed along the first surface 310a and thus proximal from the conductor 340. In some embodiments, the first surface 310a may be referred to as an active surface. A die down assembly may be used in current sensors, where it is important for the magnetic field sensing element 315 to be as close the conductor 340 as possible.

The magnetic field sensing element 315 may be diffused into the first surface 310b or otherwise disposed on or supported by the first surface 310b. While only one magnetic field sensing element 315 is shown, it should be appreciated that more than one magnetic field sensing element 315 may be used in current sensor 300.

In an embodiment, the magnetic field sensing element 315 may include a Hall-effect element or a magnetoresistance element. For example, the magnetoresistance elements may include at least one of Indium Antimonide (InSb), a GMR element, an AMR element, a TMR element or a MTJ element.

The current sensor 300 may be provided as an integrated circuit (IC) having a lead frame. The lead frame may have two portions, a first portion for carrying a primary current to be detected and a second portion for carrying signals to and from the current sensor 300. In an embodiment, the first portion of the lead frame may provide the conductor 340 and the second portion of lead frame may comprise a plurality of signal leads 345.

In an embodiment, the shield layer 320 and the insulation layer 330 can be disposed between the magnetic field sensing element 315 (and semiconductor substrate 310) and the conductor 340. The first surface 310a of the semiconductor substrate 310 is disposed along a first surface of the shield layer 320. Therefore, the magnetic field sensing element 315 is proximal to the shield layer (with respect to the second surface 310b which is distal from the shield layer 320). In some embodiment, this type of shielding may be referred to as top metal shielding as the magnetic field sensing element 315 and the active first surface 310a are proximal to the shield layer 320.

The shield layer 320 may be applied to or otherwise coated on the first surface 310a of the substrate 310. For example, the shield layer 320 may be plated to the first surface 310a. In other embodiments, the shield layer 320 may be disposed on the insulation layer 330 and the substrate 310 may be disposed on the shield layer 320. The insulation layer 330 may be applied or otherwise coated to a first surface of the conductor 340. In an embodiment, the shield layer 320 may be applied to the substrate 310 and the insulation layer 330 may be applied to the conductor 340 as initial steps in a manufacturing process of current sensor 300. Thus, the shield layer 320 may be applied or attached to the insulation layer 330 to couple the substrate 310 to the conductor 340.

In some embodiments, to limit the amount of eddy currents forming in the shield layer 320, the shield layer 320 may include an aperture, hole, or opening 370 (e.g., a slot, slit, cut, cross shape opening or any other type of opening to aid in the reduction of eddy currents which may affect magnetic field sensing element 315). For example, and referring briefly to FIG. 3A, a slit 370 can be formed into the shield layer 320 such that the slit 370 is generally aligned with the magnetic field sensing element 315. In some embodiments, slit 370 may be formed such that is not generally aligned (e.g., not centered) or positioned over magnetic field sensing element 315.

Figure 3A:
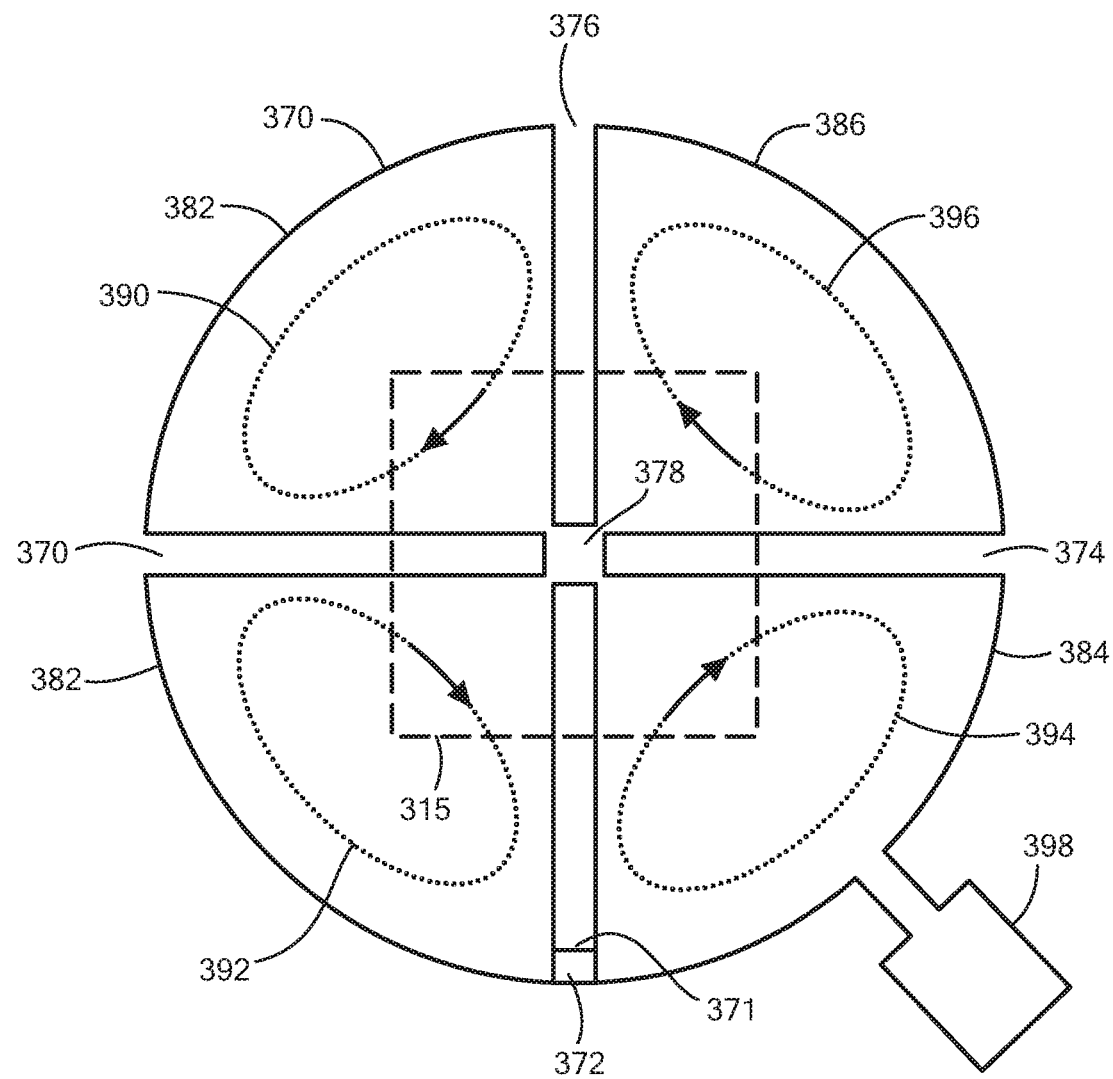
FIG. 3A is a diagram of a bottom surface of shield layer having a plurality of slots.

In FIG. 3A, a bottom surface of the shield layer 320 is shown. The slit 370 may be formed as a cross shape having a center open region that exposes the magnetic field sensing element 315 to the insulation layer 330 and conductor 340 under the insulation layer 330. In some embodiments, the slit 370 may have the same dimensions (e.g., length, width) as the magnetic field sensing element 315. In other embodiments, the slit 370 may have different dimensions (e.g., smaller dimensions, larger dimensions) than the magnetic field sensing element 315. For example, and as shown in FIG. 3A, the slit 370 may be formed as a cross shape having a center open region that exposes the magnetic field sensing element 315 to the insulation layer 330 and conductor 340 under the insulation layer 330. In some embodiments, connections 371 may be formed at the edges of the shield layer 320 such that the slots or slits or openings 372, 370, 376, 374 are open and/or no conductor portion connects these regions over the magnetic field sensing element 315.

In the illustrative embodiment of FIG. 3A, the shield layer 320 includes four portions 380-386 separated by four slits 370-376. The four portions 380-386 can be coupled with a conductive region 378. A bonding pad 398 may be provided to allow the shield layer 320 to be coupled to a reference potential. In some embodiments, a connection may be made to circuitry disposed within or on a layer of semiconductor substrate 310 using standard via and/or metallization technology. In the presence of a magnetic field, it will be understood that eddy currents 390-396 can be induced in the shield layer 320. Due to the four slits 370-376, it will be understood that properties of a current path (i.e., a diameter or a path length) of the closed looped eddy currents 390-396 can be altered. For example, slits 370-376 may be formed such that the diameter of eddy currents paths 390-396, in an area of magnetic field sensing element 315, may be reduced. In some embodiments, responsive to a reduction of eddy currents 390-396, a vector or a direction of a magnetic field near magnetic field sensing element 315 may be changed. Thus, an effective field from any eddy current 390-396 as measured by magnetic field sensing element 315 may be lower than if the slits 370-376 were not present in shield layer 320. In some embodiments, slits 370-376 may be formed such that eddy currents paths 390-396 are eliminated.

It will be understood that the reduced size of the closed loops in which the eddy currents 390-396 travel results in smaller eddy currents 390-396 and a smaller local effect on the AC magnetic field that induced the eddy current. Therefore, the sensitivity of the current sensor 300 on which the magnetic field sensing element 315 and the shield layer 320 are used is less affected by the smaller eddy currents 390-396. Furthermore, by placing the shield layer 320 in relation to the magnetic field sensing element 315 as shown, so that the slits 370-376 pass over the magnetic field sensing element 315, it will be understood that the magnetic field associated with any one of the eddy currents 390-396, tends to form magnetic fields passing through the magnetic field sensing element 315 in two directions, canceling over at least a portion of the area of the magnetic field sensing element 315. It will also be appreciated that other shapes, sizes, and configurations of one or more slits in the shield layer 320 are possible, such as those shown in U.S. Pat. No. 7,598,601, entitled "Current Sensor," issued on Oct. 6, 2009, assigned to the assignee of the subject application and incorporated herein by reference.

Referring back to FIG. 3, the via 350 may be formed in the semiconductor substrate 310. The via 350 may be a through-silicon via and extend from the first surface 310a to the second surface 310b of the semiconductor substrate 310. An interconnect 360 may electrically couple the via 350 to at least one of the signal leads 345. In some embodiments, the shield layer 320 can be coupled to a reference potential (e.g., a reference voltage, a supply voltage, a DC voltage, ground voltage) through the via 350.

Figure 4:
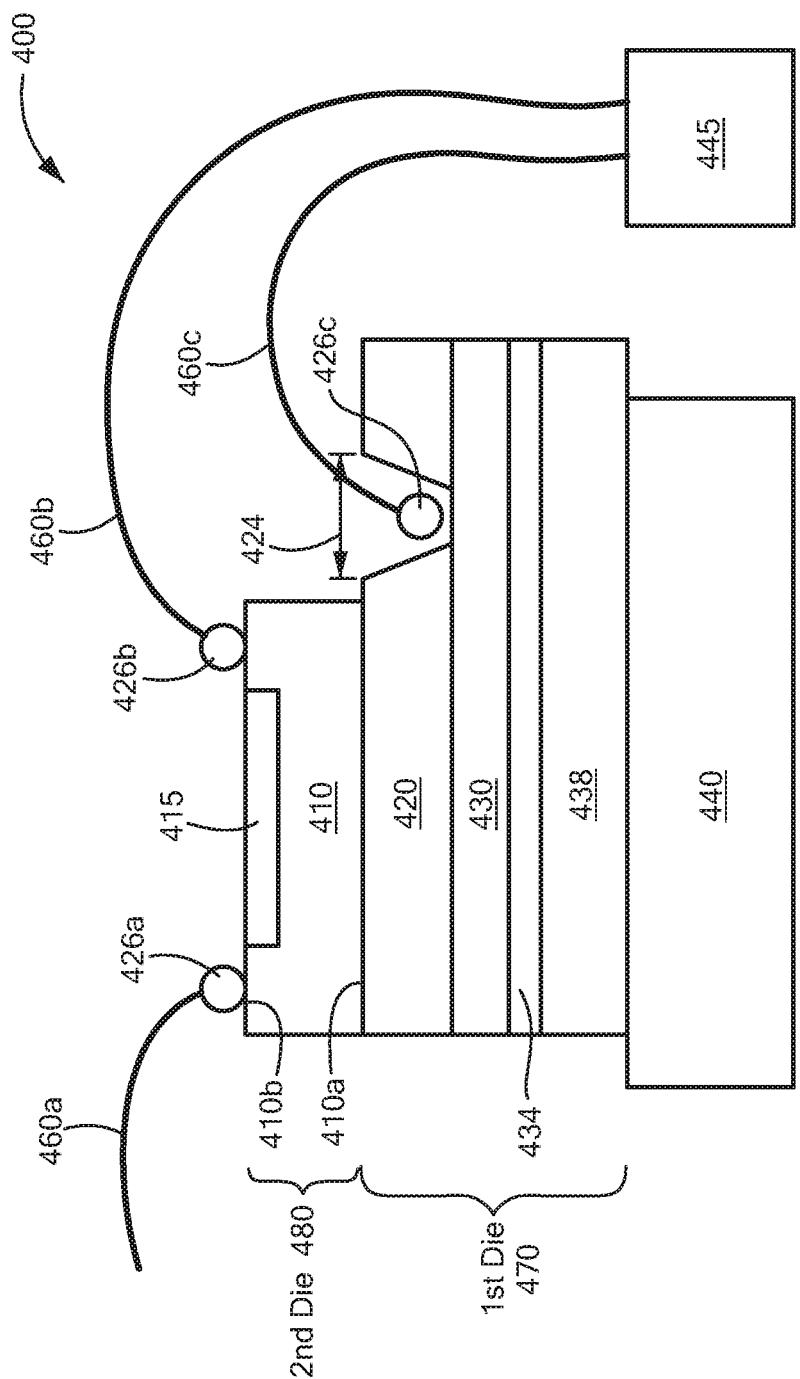
FIG. 4 is a cross section of a current sensor having a dual die assembly.

Now referring to FIG. 4, a current sensor 400 having a dual die assembly, also referred herein as a stacked die assembly, is provided. The current sensor 400 includes a conductor 440, a first die 470 having a first surface proximal to the conductor 440 and a second opposing surface distal from the conductor 440 and a second die 480 having a first surface 410a proximal to the first die 470 and a second opposing surface 410b distal from the first die 470 and supporting a magnetic field sensing circuit. In an embodiment, the first die 470 may include a shield layer 430 and as will be described in greater detail below, the first die 470 may operate as an insulation layer and/or a shielding layer for the second die 480.

In an embodiment, the current sensor 400 can be an IC having a lead frame. The lead frame may have two portions, a first portion for carrying a primary current to be detected and a second portion for carrying signals to and from the current sensor. In an embodiment, the first portion may provide the conductor 440 and the second portion may include a plurality of signal leads 445.

The first die 470 may include a substrate 438, a shield layer 430 having a first surface proximal to the second surface of the substrate 438 and a protective layer 420 having a first surface proximal to the second surface of the shield layer and having a second opposing surface.

In some embodiments, the first die may include a first insulation layer 434 having a first surface proximal to the second surface of the substrate 438 and having a second opposing surface. The first insulation layer 434 may be disposed between the shield layer 430 and the substrate 438. In other embodiments, the substrate 438 may be an insulating substrate and the first insulation layer 434 may not be necessary. In some embodiments, an additional insulating layer may be disposed on or otherwise formed on a backside of substrate 438 such that there is an insulating layer between substrate 438 and the conductor 440. The additional layer and first insulation layer 434 may include thermal oxide, an LPCVD nitride or oxide, oxide and nitride layers, or other insulating material suitable for a semiconductor process.

The protective layer 420 may include a polymer dielectric material (e.g., polyimide material) or benzo-cyclobutene (BCB). The shield layer 430 can be disposed over a surface of the protective layer 420. For example, the shield layer 430 may be applied to or otherwise coated on a surface of the protective layer 420. In other embodiments, the protective layer 420 may be applied or otherwise coated on a surface of the shield layer 430.

The shield layer 430 may include copper, aluminum or other types of conductive metal materials. In some embodiments, the shield layer 430 may be applied to or otherwise coated on a first surface of the substrate 438. In other embodiments, the shield layer 430 may be applied to or otherwise coated on a first surface of the insulation layer 434, which is disposed on the first surface of the substrate 438.

The insulation layer 434 can be disposed over a first surface of the substrate 438. The insulation layer 434 may be applied or coated to the first surface of the substrate 438. The insulation layer 434 may include silicon oxide, silicon dioxide or a combination of both. In some embodiments, the substrate 438 may include a semiconductor material, such as a silicon wafer. In other embodiments, the substrate 438 may be an insulating substrate and include materials such as Alumina or glass.

Figure 5:
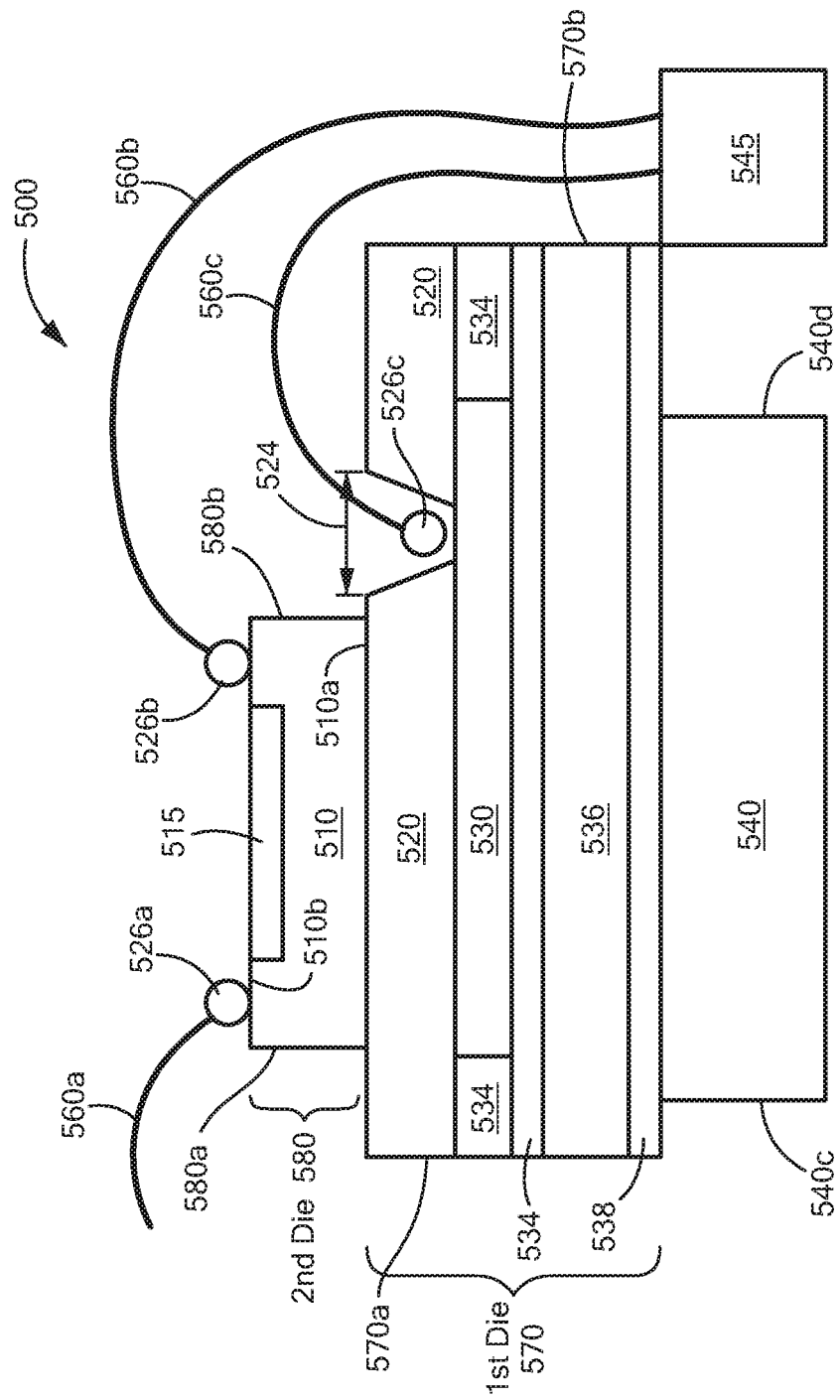
FIG. 5 is a cross section of a current sensor having a dual die assembly and a second insulation layer between a conductor and a first die.

In some embodiments, a length of the shield layer 430 may be less than a length of the first die 470 (e.g., the shield layer 430 may not extend the full length of the first die 470, also as illustrated in FIG. 5). For example, the first die 470 may have a length defined by a first and second edge. The shield layer 430 may not extend to one of the first edge, second edge or both. In an embodiment, the shield layer 430 may be the same length as the second die 480 and positioned under the second die 480. In other embodiments, the length of the shield layer 430 may be larger than the length of the second die, for example, to allow the shield layer 430 to be bonded to the reference potential though the aperture 424 in the protective layer 420. In an embodiment, in which the shield layer 430 does not extend a full length of the first die 470, one or more portions of insulation material may be deposited on either or both edges of the shield layer 430 to extend that layer in the stack the full length of the first die 470.

In an embodiment, an aperture, hole, or opening 424 may be formed into the protective layer 420. A bond pad 426 may be disposed in the aperture 424. The bond pad 426 may be in contact with the shield layer 430 through the aperture 424 to electrically couple the shield layer 430 to at least one of the signal leads 445 through an interconnect 460c. The interconnect 460c may be a wire bond. In some embodiments, the bond pad 426 is a ground pad that is coupled to a ground signal lead 445 of the current sensor 400. Thus, the shield layer 430 can be coupled to a reference potential (e.g., a reference voltage, a supply voltage, a DC voltage, ground voltage).

The second die 480 may include a substrate 410 having a first surface 410a and a second surface 410b. The substrate 410 may be a semiconductor material. A magnetic field sensing circuit 415 and associated circuitry may be disposed along the second surface 410b. The magnetic field sensing circuit 415 may include an integrated circuit (IC), having at least one magnetic field transducer or sensing element (e.g., a Hall-effect element, magnetoresistance element, giant magnetoresistance element and interface circuitry (not shown)) of a magnetic field sensor provided therein. The substrate 410 may be a semiconductor material or an insulating substrate.

In an embodiment, the magnetic field sensing element 415 may include a Hall-effect element or a magnetoresistance element. For example, the magnetoresistance elements may include at least one of Indium Antimonide (InSb), a GMR element, an AMR element, a TMR element or a MTJ element. The magnetic field sensing element 415 may be diffused into the second surface 410b or otherwise disposed on or supported by the second surface 410b. While only one magnetic field sensing element 415 is shown, it should be appreciated that more than one magnetic field sensing element 415 may be used in current sensor 400.

In an embodiment, a plurality of interconnects 460a-460b may electrically couple the second surface 410b to at least one signal lead 445. In some embodiments, the interconnects 460a-460b may be coupled to the second surface 410b. The interconnects 460a-460b can be configured to couple the magnetic field sensing circuit 415 and associated circuitry (i.e. active circuitry) to at least one of the signal leads 445.

In an embodiment, the first die 470 may operate as an insulation layer and/or a shielding layer for the second die 480. For example, and as illustrated in FIG. 4, the first die 470 is disposed between the second die 480 and the conductor 440. The first die 470 can be configured to provide shielding and insulation (e.g. protective layer 420, shield layer 430) for the magnetic field sensing circuit, including a magnetic field sensing element 415, from the current carrying conductor 440. Thus, in an embodiment, the current sensor 400 can have a grounded shield layer 430 in a die up assembly without using vias, such as those used in the current sensors 100, 200, 300 described above with respect to FIGS. 1-3.

In some embodiments, the length of a layer in current sensor 400 (e.g., length of first die 470, second die 480, insulation layer 434) may be selected relative to another layer based on creepage and clearance considerations. For example, in some embodiments, to meet a specific standard or need of a particular application of the current sensor 400, the first die 470 may be larger (in terms of length or width) than the conductor 440 and/or the second die 480 to meet a clearance and/or creepage requirement and increase a distance between two conductive parts of the current sensor 400. The length or distance by which the first die 470 extends beyond a length of the second die 480 and/or conductor 440 may vary based on a particular application. For example, a first edge and/or a second edge of the first die 470 may extend past a first edge and/or second edge of the conductor 440, the second die 480 or both.

Now referring to FIG. 5, a current sensor 500 having a dual die assembly, also referred herein as a stacked die assembly, is provided. The current sensor 500 includes a conductor 540, a first die 570 having a first surface proximal to the conductor 540 and a second opposing surface distal from the conductor 540 and a second die 580 having a first surface 510a proximal to the first die 570 and a second opposing surface 510b distal from the first die 570 and supporting a magnetic field sensing circuit. In an embodiment, the first die 570 may include a shield layer 530 and as will be described in greater detail below, the first die 570 may operate as an insulation layer and/or a shielding layer for the second die 580.

In an embodiment, current sensor 500 may be similar to current sensor 400 described above with respect to FIG. 4, as in current sensor 500 has a dual die (e.g. first die 570, second die 580) assembly. However, current sensor 500 may further include a second insulation layer 538 in the first die 570.

In an embodiment, the current sensor 500 can be provided in the form of an IC having a lead frame. The lead frame may have two portions, a first portion for carrying a primary current to be detected and a second portion for carrying signals to and from the current sensor. In an embodiment, the first portion may provide the conductor 540 and the second portion may include a plurality of signal leads 545.

The first die 570 may include a substrate 536, a shield layer 530 having a first surface proximal to the second surface of the substrate 538 and a protective layer 520 having a first surface proximal to the second surface of the shield layer and having a second opposing surface.

In some embodiments, the first die may include a first insulation layer 534 having a first surface proximal to the second surface of the substrate 530 and having a second opposing surface. The first insulation layer 534 may be disposed between the shield layer 530 and the substrate 538. In some embodiments, the first insulation layer 534 may include one or more layers of insulation. The one or more layers of the first insulation layer 534 may include different materials. In other embodiments, each of the multiple first insulation layers 534 may include the same materials. In some embodiments, the substrate 538 may be an insulating substrate and the first insulation layer 534 may not be necessary.

The first die 570 may include a second insulation layer 538 disposed between the conductor 540 and the substrate 536. The second insulation layer 538 may be applied or coated to a surface of the substrate 536. In other embodiments, the second insulation layer 538 may be applied or coated to a surface of the conductor 540 and the substrate 536 may be disposed over a first surface of the second insulation layer 538. Thus, the second insulation layer 538 may be disposed over the second surface of the substrate 536 or the first surface of the conductor 540.

In an embodiment, the protective layer 520 may include a polymer dielectric material or benzocyclobutene (BCB). The shield layer 530 may be applied to a surface of the protective layer 520. In other embodiments, the protective layer 520 may be applied or coated over a surface of the shield layer 530. In some embodiments, protective layer 520 may include a PECVD oxide, nitride and alumina combination (e.g., aluminum oxide). In one embodiment, protective layer 520 may include a PECVD oxide, nitride and alumina combination (e.g., aluminum oxide) in combination with BCB and/or PI (polyimide).

In an embodiment, the shield layer 530 may be disposed over a first surface of the first insulation layer 534. For example, the shield layer 530 may be applied or coated over the first surface of the first insulation layer 534. The shield layer 530 may include copper, aluminum or other types of conductive metal materials.

The first insulation layer 534 can be disposed over a first surface of the substrate 536. The first insulation layer 534 may be applied or coated over the first surface of the substrate 536. In other embodiments, the first insulation layer 534 may be applied to a surface of the shield layer 530 and then disposed on the substrate 536. The first insulation layer 534 may include silicon oxide, silicon dioxide or a combination of both. The substrate 536 may include a semiconductor material, such as a silicon wafer. In other embodiments, the substrate 536 may be an insulating substrate and include materials such as Alumina or glass.

In an embodiment, the second insulation layer 538 may include a polymer dielectric material. For example, the polymer dielectric material may include at least one of BCB, a polyimide material, or a layer of adhesive. In some embodiments, the second insulation layer 538 may include a flex circuit having a layer of Kapton® and a metalized layer.

In some embodiments, the first die 570 may include a flex circuit. For example, the flex circuit may include a first layer of Kapton®, a metalized layer disposed over the first layer of Kapton®, a second layer of Kapton® disposed over the metallization layer and a third insulation layer disposed over the second layer of Kapton®.

In an embodiment, an aperture, hole, or opening 524 may be formed into the protective layer 520. A bond pad 526 may be disposed in the aperture 524. The bond pad 526 may be in contact with the shield layer 530 through the aperture 524 to electrically couple the shield layer 530 to at least one of the signal leads 545 through an interconnect 560c. The interconnect 560c may be a wire bond. In some embodiments, the bond pad 526 is a ground pad that is coupled to a ground signal lead 545 of the current sensor 500. Thus, the shield layer 530 can be coupled to a reference potential (e.g., a reference voltage, a supply voltage, a DC voltage, ground voltage).

The second die 580 may include a substrate 510 having a first surface 510a and a second surface 510b. The substrate 510 may be a semiconductor material or an insulating substrate. A magnetic field sensing element 515 and associated circuitry may be disposed along the second surface 510b. In an embodiment, the magnetic field sensing element 515 may include a Hall-effect element or a magnetoresistance element. For example, the magnetoresistance elements may include at least one of Indium Antimonide (InSb), a GMR element, an AMR element, a TMR element or a MTJ element.

The magnetic field sensing element 515 may be diffused into the second surface 510b or otherwise disposed on or supported by the second surface 510b. While only one magnetic field sensing element 515 is shown, it should be appreciated that more than one magnetic field sensing element 515 may be used in current sensor 500.

In an embodiment, a plurality of interconnects 560a-560b may electrically couple the second surface 510b to at least one signal lead 545. In some embodiments, the interconnects 560a-560b may be coupled to the second surface 510b. In an embodiment, bond pads may be disposed on the second surface 610 b to couple to the interconnects 560a-560b. The interconnects 560a-560b can be configured to couple the magnetic field sensing element 515 (i.e. active circuitry) to at least one of the signal leads 545.

In the illustrative embodiment of FIG. 5, current sensor 500 includes the second insulation layer 538 in the first die 570. The second insulation layer 538 may include one or more layers of insulation. In an embodiment, the one or more layers of the second insulation layer 538 may include different materials. In other embodiments, each of the multiple second insulation layers 538 may include the same materials.

In an embodiment, the second insulation layer 538 may provide a second layer of voltage isolation for the magnetic field sensing element 515 from the conductor 540. For example, the first die 570 may operate as an insulation layer and/or a shielding layer for the second die 580. The first die 570 is disposed between the second die 580 and the conductor 540. The first die 570 can be configured to provide multiple layers of shielding and/or insulating (e.g. protective layer 520, shield layer 530, first insulation layer 534, second insulation layer 538) for the magnetic field sensing element 515 from the current carrying conductor 540. In some embodiments, the second insulation layer 538 may be referred to as a wafer backside coating.

In some embodiments, the first die 570 may be larger (e.g. width, length) than the conductor 540 and/or the second die 580. The length of a layer in current sensor 500 (e.g., length of first die 570, second die 580) may be selected relative to another layer based on creepage and clearance considerations. For example, the first die 570 may have at least one edge 570a, 570b that extends beyond an edge 540c, 540d of the conductor 540 and/or an edge 580a, 580b of the second die 580. In some embodiments, both a first edge 570a of the first die 570 extends beyond a first edge 540c of the conductor 540 and a second edge 570b of the first die 570 extends beyond second edge 540b of the conductor 540. A first edge 570a of the first die 570 may extend beyond a first edge 580a of the second die 580 and a second edge 570b of the first die 570 may extend beyond a second edge 580b of the second die 580.

In an embodiment, to meet a specific standard or need of a particular application of the current sensor 500, the first die 570 may be larger (in terms of length or width) than the conductor 540 and/or the second die 580 to meet a clearance and/or creepage requirement and increase a distance between two conductive parts of the current sensor 500. In some embodiments, having the first die 570 larger than the conductor 540, the second die 580 or both to provide further voltage isolation for the magnetic field sensing element 515 from the conductor 540.

In an embodiment, the second edge 570b may span a gap between the second edge 540b of the conductor 540 and at least one signal lead 545. Therefore, in some embodiments, the second edge 540b may be in contact with at least one signal lead 545.

Figure 6:
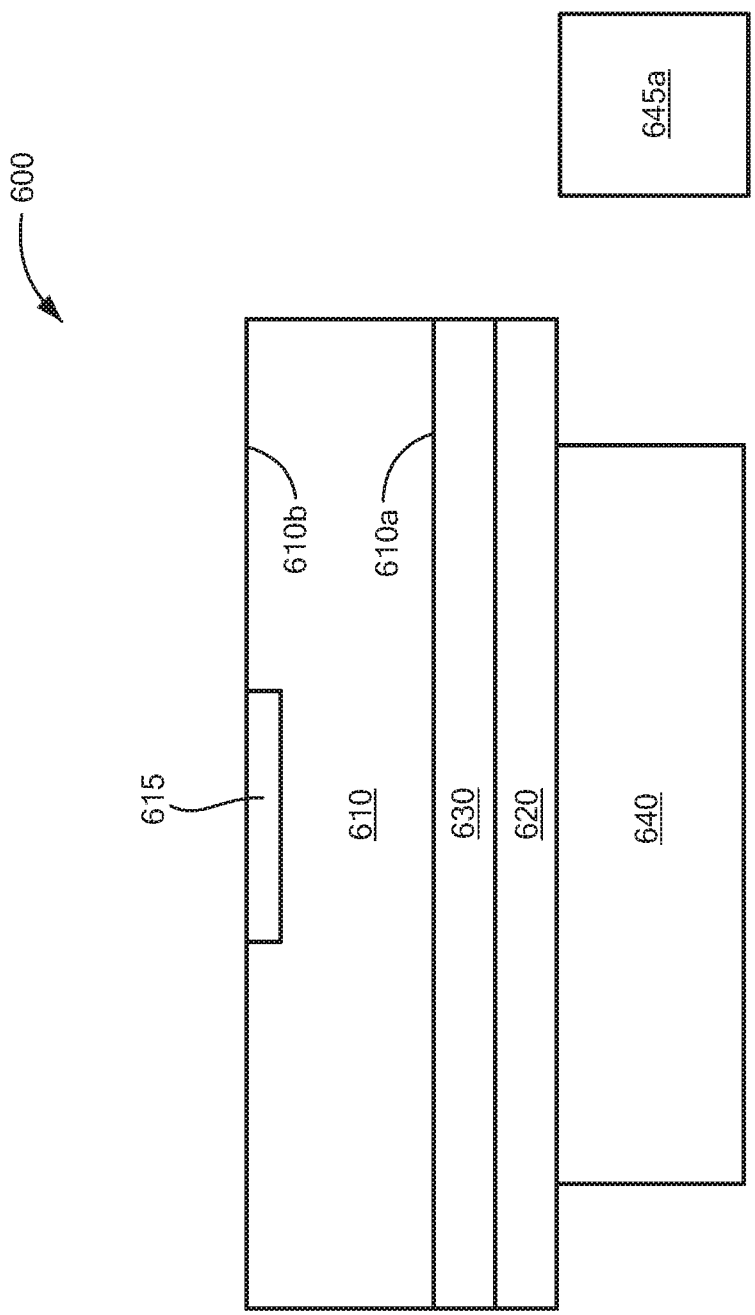
FIG. 6 is a cross section of a current sensor having a floating back side shield layer.

Now referring to FIG. 6, a current sensor 600 having a die up assembly and with a shield layer 630 to reduce the effects of electrical, voltage, or electrical transient noise coupled to the active circuitry through parasitic capacitance between the conductor 640 and the circuitry. The current sensor 600 includes a conductor 640, an insulation layer 620 in contact with the conductor 640, a shield layer 630 comprising at least one of a metalized tape or a metalized Mylar® spaced from the conductor 640 by the insulation layer 630 and a semiconductor substrate 610 having a first surface 610a disposed proximal to the shield layer 630 and a second opposing surface 610b disposed distal from the shield layer 630 and supporting a magnetic field sensing element 615.

Current sensor 600 may be provided in the form of an integrated circuit having a lead frame. The lead frame may include a first portion for carrying a primary current and a second portion for carrying signals to and from the current sensor 600. In an embodiment, the first portion of the lead frame may provide the conductor 640 and the second portion may comprise a plurality of signal leads 645a, 645b.

In an embodiment, the semiconductor substrate 610 may have a first surface 610a disposed proximal to the shield layer 630 and a second surface 610b disposed distal from the shield layer 630. A magnetic field sensing element 615 and associated circuitry may be disposed on the second surface 610b. Thus, the second surface 610b may support the magnetic field sensing element 615 and associated circuitry and the current sensor 600 may have a die up assembly. The magnetic field sensing element 615 may include at least one of a Hall-effect element or a magnetoresistance element. For example, the magnetoresistance element may include at least one of Indium Antimonide (InSb), a GMR element, an AMR element, a TMR element or a MTJ element.

The magnetic field sensing element 615 may be diffused into the second surface 610b or otherwise disposed on or supported by the second surface 610b. While only one magnetic field sensing element 615 is shown, it should be appreciated that more than one magnetic field sensing element 615 may be used in current sensor 600.

The shield layer 630 can be disposed between the semiconductor substrate 610, having the magnetic field sensing element 615, and the insulation layer 620. The shield layer 630 can be spaced from the conductor 640 by the insulation layer 620 and therefore, the shield layer 630 is disposed between the magnetic field sensing element 615 and the current carrying conductor 640. In some embodiments, the shield layer 630 may be applied to or otherwise coated on the first surface 610a of the substrate 610. For example, the shield layer 630 may be plated to the first surface 610a. In other embodiments, the shield layer 630 may be disposed on the insulation layer 620 and the substrate 610 may be disposed on the shield layer 630.

The shield layer 630 may include at least one of a metalized tape or metalized Mylar®. In some embodiments, the shield layer 630 may include multiple layers (e.g. two or more layers). For example, an adhesive layer or a nonconductive adhesive layer may be disposed over or otherwise formed over a first surface of shield layer 630 such that is it between shield layer 630 and semiconductor substrate 610. In an embodiment, one or more of the shield layers 630 may include different materials. In other embodiments, each of the multiple shield layers 630 may include the same materials.

In an embodiment, current sensor 600 may have a floating shield layer 630 (e.g. not grounded). For example, the shield layer 630 may not be coupled to a reference potential (e.g., a reference voltage, a supply voltage, a DC voltage, ground voltage) or signal leads 645a, 645b.

The insulation layer 620 may be applied or coated to a surface of the conductor 640. In an embodiment, the substrate 610 may be mounted or otherwise disposed on the conductor 640. The substrate 610 may be mounted after the shield layer 630 has been applied to the first surface 610a and after the insulation layer 620 has been applied to the first surface of the conductor 640. Thus, the shield layer 630 can be mounted on or otherwise disposed on the insulation layer 620 and make contact with the insulation layer 620. In an embodiment, the substrate 610 may be separated from the conductor 640 by at least the shield layer 630 and the insulation layer 620.

Figure 7:
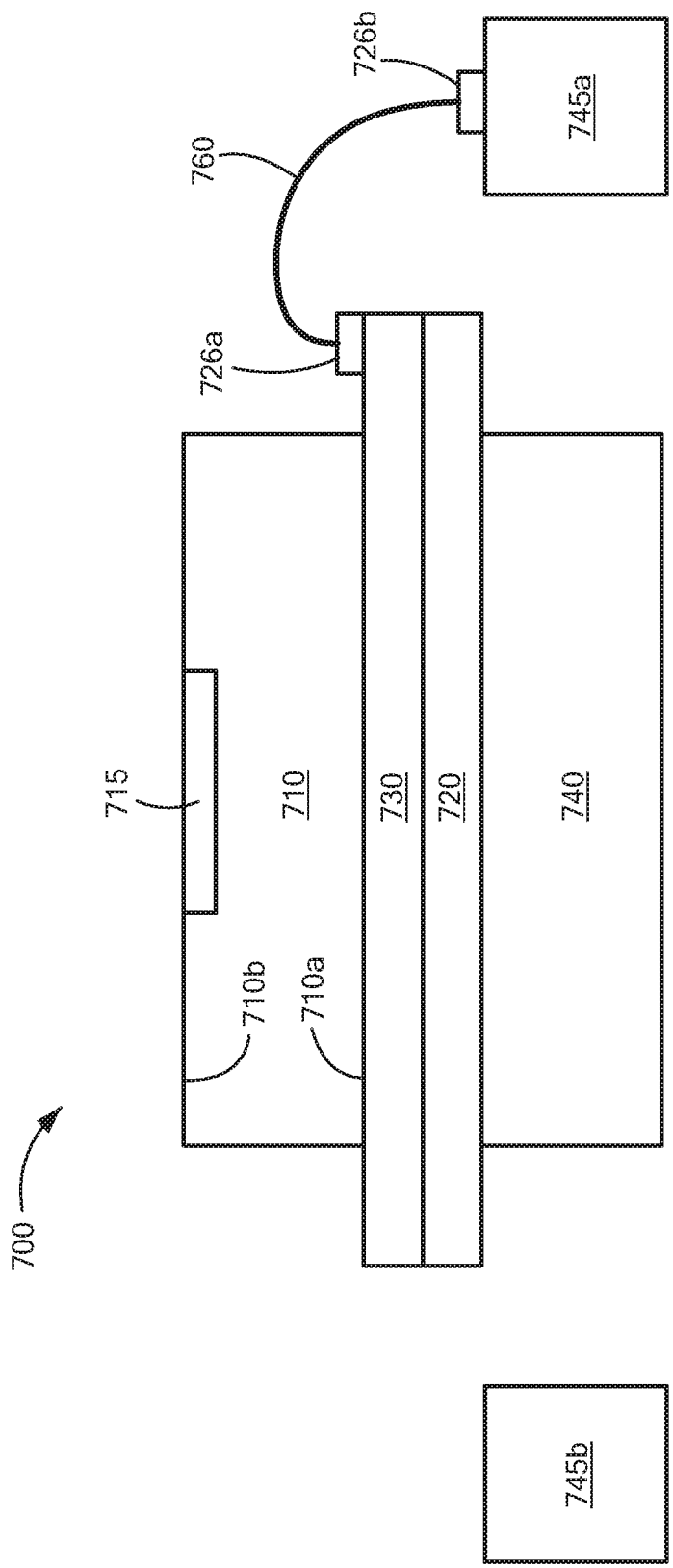
FIG. 7 is a cross section of a current sensor having a bonded back side shield layer.

Now referring to FIG. 7, a current sensor 700 having a die up assembly and with a shield layer 730 to reduce the effects of electrical, voltage, or electrical transient noise coupled to the active circuitry through parasitic capacitance between the conductor 740 and the circuitry. The current sensor 700 includes a conductor 740, an insulation layer 720 in contact with the conductor 740, a shield layer 730 comprising at least one of a metalized tape or a metalized Mylar® spaced from the conductor 740 by the insulation layer 730 and a semiconductor substrate 710 having a first surface 710a disposed proximal to the shield layer 730 and a second opposing surface 710b disposed distal from the shield layer 730 and supporting a magnetic field sensing element 715.

Current sensor 700 may be provided in the form of an integrated circuit having a lead frame. The lead frame may include a first portion for carrying a primary current and a second portion for carrying signals to and from the current sensor 700. In an embodiment, the first portion of the lead frame may provide the conductor 740 and the second portion may comprise a plurality of signal leads 745a, 745b.

The semiconductor substrate 710 may have a first surface 710a disposed proximal to the shield layer 730 and a second surface 710b disposed distal from the shield layer 730. A magnetic field sensing element 715 may be disposed long the second surface 710b. Thus, the second surface 710b may support the magnetic field sensing element 715 and associated circuitry (i.e. magnetic field sensing circuit) and the current sensor 700 has a die up assembly.

The magnetic field sensing element 715 may include at least one of a Hall-effect element or a magnetoresistance element. For example, the magnetoresistance element may include at least one of Indium Antimonide (InSb), a GMR element, an AMR element, a TMR element or a MTJ element. The magnetic field sensing element 715 may be diffused into the second surface 710b or otherwise disposed on or supported by the second surface 710b. While only one magnetic field sensing element 715 is shown, it should be appreciated that more than one magnetic field sensing element 715 may be used in current sensor 700.

As illustrated in FIG. 7, the shield layer 730 is disposed between the semiconductor substrate 710, having the magnetic field sensing element 715, and the insulation layer 720. In some embodiments, this may be referred to as a backside die shield, as the first surface 710a distal from the magnetic field sensing element 715 is coated with the shield layer 730. The shield layer 730 may be applied to or otherwise coated on the first surface 710a of the substrate 710. For example, the shield layer 730 may be plated to the first surface 710a. In other embodiments, the shield layer 730 may be disposed on the insulation layer 720 and the substrate 710 may be disposed on the shield layer 720.

The shield layer 730 may include at least one of a metalized tape or metalized Mylar®. In some embodiments, the shield layer 730 may include multiple layers (e.g. two or more layers). For example, an adhesive layer or a nonconductive adhesive layer may be disposed over or otherwise formed over a first surface of shield layer 730 such that is it between shield layer 730 and semiconductor substrate 710. In an embodiment, one or more of the shield layers 730 may include different materials. In other embodiments, each of the multiple shield layers 730 may include the same materials.

The shield layer 730 can be spaced from the conductor 740 by the insulation layer 720 and therefore, the shield layer 730 can be disposed between the magnetic field sensing element 715 and the current carrying conductor 740. The insulation layer 720 may be applied or coated to a surface of the conductor 740. In an embodiment, the substrate 710 may be mounted or otherwise disposed on the conductor 740. The substrate 710 may be mounted after the shield layer 730 has been applied to the first surface 710a and after the insulation layer 720 has been applied to the first surface of the conductor 740. Thus, the shield layer 730 can be mounted on or otherwise disposed on the insulation layer 720 and make contact with the insulation layer 720.

Current sensor 700 may be different from current sensor 600 described above with respect to FIG. 6, in that the shield layer 730 is coupled to at least one signal lead 745a. For example, an interconnect 760 may couple the shield layer 730 to at least one signal lead 745a. A first bond pad 726a (or connection area as it may not be a patterned pad) may be disposed on the first surface of the shield layer 730 and a second bond pad 726b may be disposed on a first surface of the signal lead 745a. The interconnect 760 may be coupled to both the first bond pad 726a and the second bond pad 726b. The interconnect 760 may include a wire bond. In an embodiment, the shield layer 730 may be coupled to a reference potential (e.g., a reference voltage, a supply voltage, a DC voltage, ground voltage) through the interconnect 760. Thus, in operation, the shield layer 730, which is electrically coupled to a reference potential, serves to tie one place of undesirable parasitic capacitance between the conductor 740 and substrate 710 to the reference potential (e.g., ground).

Figure 8:
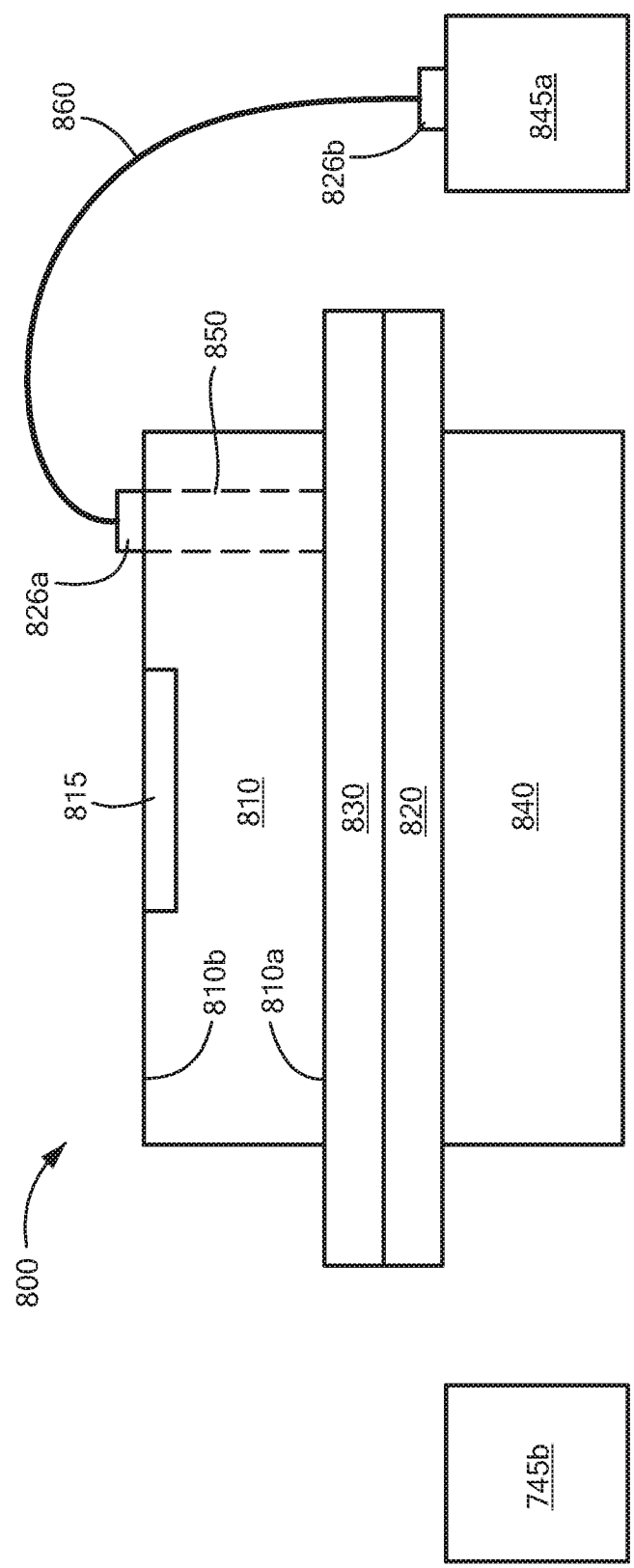
FIG. 8 is a cross section of a current sensor having a back side shield layer and a through silicon via to couple the shield layer to a reference potential.

Now referring to FIG. 8, a current sensor 800 having a die up assembly and with a shield layer 830 to reduce the effects of electrical, voltage, or electrical transient noise coupled to the active circuitry through parasitic capacitance between the conductor 840 and the circuitry. The current sensor 800 includes a conductor 840, an insulation layer 820 in contact with the conductor 840, a shield layer 830 comprising at least one of a metalized tape or a metalized Mylar® spaced from the conductor 840 by the insulation layer 830 and a semiconductor substrate 810 having a first surface 810a disposed proximal to the shield layer 830 and a second opposing surface 810b disposed distal from the shield layer 830 and supporting a magnetic field sensing element 815.

Current sensor 800 may be provided in the form of an integrated circuit having a lead frame. The lead frame may include a first portion for carrying a primary current and a second portion for carrying signals to and from the current sensor 800. In an embodiment, the first portion of the lead frame may provide the conductor 840 and the second portion may comprise a plurality of signal leads 845a, 845b.

The semiconductor substrate 810 may have a first surface 810a disposed proximal to the shield layer 830 and a second surface 810b disposed distal from the shield layer 830. A magnetic field sensing element 815 may be disposed long the second surface 810b. Thus, the second surface 810b may support the magnetic field sensing element 815 and associated circuitry (i.e. magnetic field sensing circuit) and the current sensor 800 has a die up assembly. The magnetic field sensing element 815 may include at least one of a Hall-effect element or a magnetoresistance element. For example, the magnetoresistance element may include at least one of Indium Antimonide (InSb), a GMR element, an AMR element, a TMR element or a MTJ element.

The magnetic field sensing element 815 may be diffused into the second surface 810b or otherwise disposed on or supported by the second surface 810b. While only one magnetic field sensing element 815 is shown, it should be appreciated that more than one magnetic field sensing element 815 may be used in current sensor 800.

As illustrated in FIG. 8, the shield layer 830 is disposed between the semiconductor substrate 810, having the magnetic field sensing element 815, and the insulation layer 820. In some embodiments, this may be referred to as a backside die shield, as the first surface 810a distal from the magnetic field sensing element 815 is coated with the shield layer 830. The shield layer 830 may be applied to or otherwise coated on the first surface 810a of the substrate 810. For example, the shield layer 830 may be plated to the first surface 810a. In other embodiments, the shield layer 830 may be disposed on the insulation layer 820 and the substrate 810 may be disposed on the shield layer 820.

In an embodiment, the shield layer 830 may include at least one of a metalized tape or metalized Mylar®. In some embodiments, the shield layer 830 may include multiple layers (e.g. two or more layers). In an embodiment, one or more of the shield layers 830 may include different materials. In other embodiments, each of the multiple shield layers 830 may include the same materials.

The shield layer 830 can be spaced from the conductor 840 by the insulation layer 820 and therefore, the shield layer 830 can be disposed between the magnetic field sensing element 815 and the current carrying conductor 840. In operation, the shield layer 830, which is electrically coupled to a reference potential, serves to tie one place of undesirable parasitic capacitance between the conductor 840 and substrate 810 to the reference potential (e.g., ground).

The insulation layer 820 may be applied or coated to a surface of the conductor 840. In some embodiments, such as during a manufacturing process of current sensor 800, the substrate 810 may be mounted or otherwise disposed on the conductor 840. The substrate 810 may be mounted after the shield layer 830 has been applied to the first surface 810a and after the insulation layer 820 has been applied to the first surface of the conductor 840. Thus, the shield layer 830 can be mounted on or otherwise disposed on the insulation layer 820 and make contact with the insulation layer 820.

Current sensor 800 may be different from current sensor 600 described above with respect to FIG. 6 and current sensor 700 described above with respect to FIG. 7, in that a via 850 is formed within the semiconductor substrate 810. In some embodiments, the via 850 may be a through-silicon via and can extend through the semiconductor substrate 810, from the first surface 810a to the second surface 810b. The via 850 may couple the shield layer 830 to the second surface 810b of the semiconductor substrate 810. In some embodiments, a conductive adhesive, a conductive solder or like material may be sued to couple the shield layer 830 to the second surface 810b of the semiconductor substrate 810.

In some embodiments, an interconnect 860 may couple the via 850 to at least one signal lead 845a. For example, a first bond pad 826a can be disposed on the second surface 810b and a second bond pad 826b can be disposed on a first surface of the signal lead 845. The interconnect 860 can be coupled to both the first bond pad 826a and the second bond pad 826b to couple the via 850 to the signal lead 845a.

In an embodiment, the via 850 can be coupled to a reference potential (e.g., a reference voltage, a supply voltage, a DC voltage, ground voltage) through the interconnect 860. In some embodiments, the shield layer 830 can be coupled to at least one signal lead 845a through the via 850 and the interconnect 860.

Figure 9:
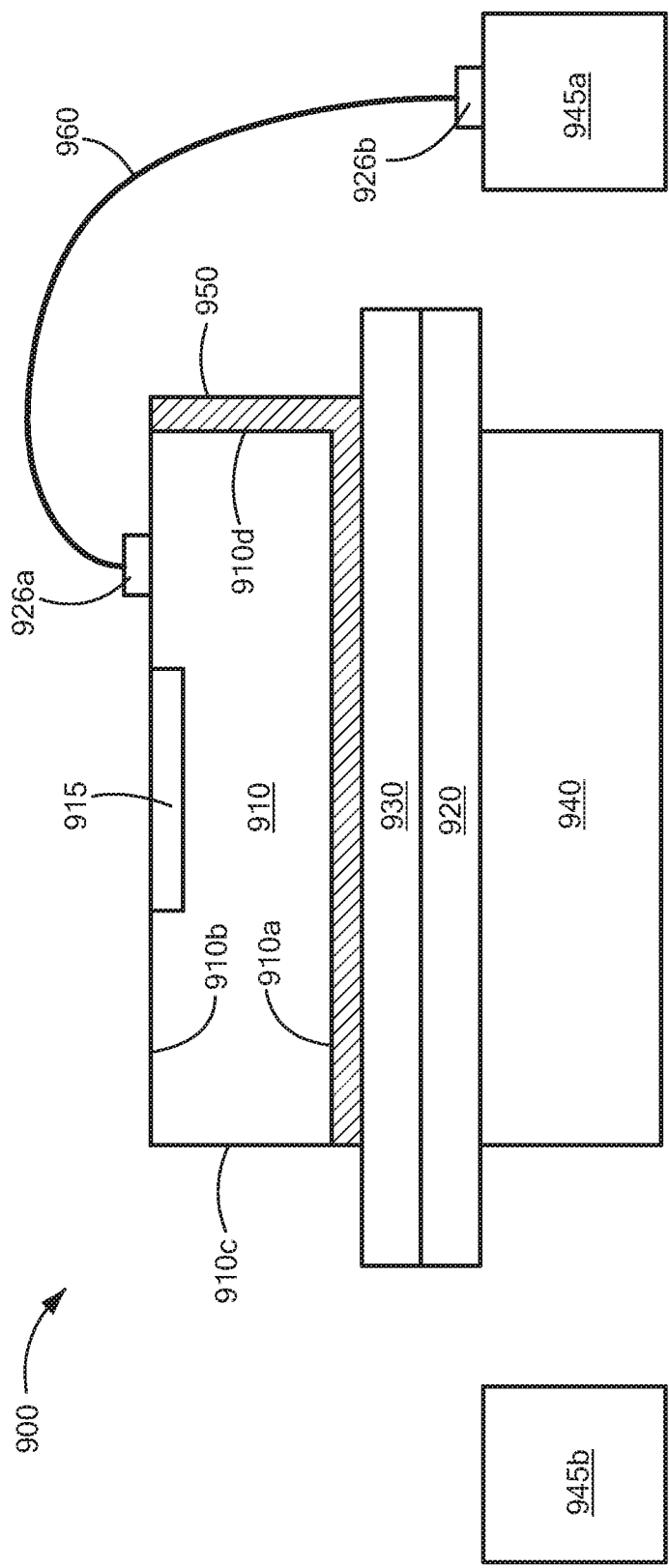
FIG. 9 is a cross section of a current sensor having a back side shield layer and a conductive epoxy formed along at least one side of a semiconductor substrate.

Now referring to FIG. 9, a current sensor 900 having a die up assembly and with a shield layer 930 to reduce the effects of electrical, voltage, or electrical transient noise coupled to the active circuitry through parasitic capacitance between the conductor 940 and the circuitry. The current sensor 900 includes a conductor 940, an insulation layer 920 in contact with the conductor 940, a shield layer 930 comprising at least one of a metalized tape or a metalized Mylar® spaced from the conductor 940 by the insulation layer 930 and a semiconductor substrate 910 having a first surface 910a disposed proximal to the shield layer 930 and a second opposing surface 910b disposed distal from the shield layer 930 and supporting a magnetic field sensing element 915.

The current sensor 900 may include a conductive epoxy layer 950 disposed over a first surface of the shield layer 930. Thus, the conductive epoxy layer 950 may be disposed between the shield layer 930 and the substrate 910. In some embodiments, the conductive epoxy layer 950 may be formed along at least one side or edge surface of the substrate 910.

Current sensor 900 may be provided in the form of an integrated circuit having a lead frame. The lead frame may include a first portion for carrying a primary current and a second portion for carrying signals to and from the current sensor 900. In an embodiment, the first portion of the lead frame may provide the conductor 940 and the second portion may comprise a plurality of signal leads 945a, 945b.

The semiconductor substrate 910 may have a first surface 910a disposed proximal to the shield layer 930 and a second surface 910b disposed distal from the shield layer 930. A magnetic field sensing element 915 may be disposed long the second surface 910b. Thus, the second surface 910b may support the magnetic field sensing element 915 and associated circuitry (i.e. magnetic field sensing circuit) and the current sensor 900 has a die up assembly. The magnetic field sensing element 915 may include at least one of a Hall-effect element or a magnetoresistance element. For example, the magnetoresistance element may include at least one of Indium Antimonide (InSb), a GMR element, an AMR element, a TMR element or a MTJ element.

The magnetic field sensing element 915 may be diffused into the second surface 910b or otherwise disposed on or supported by the second surface 910b. While only one magnetic field sensing element 915 is shown, it should be appreciated that more than one magnetic field sensing element 915 may be used in current sensor 900.

The shield layer 930 is disposed between the conductive epoxy layer 950 and the insulation layer 920. The shield layer 930 may be applied to or otherwise coated on a first surface of the conductive epoxy layer 950. In other embodiments, the shield layer 930 may be disposed on the insulation layer 920 and the conductive epoxy layer 950 may be disposed on the shield layer 930.

The shield layer 930 can be spaced from the conductor 940 by the insulation layer 1020 and can be spaced from the semiconductor substrate 910 (having the magnetic field sensing element 915) by the conductive epoxy layer 950, thus the shield layer 930 can be disposed between the magnetic field sensing element 915 and the current carrying conductor 940. In operation, the shield layer 930, which is electrically coupled to a reference potential, serves to tie one place of undesirable parasitic capacitance between the conductor 940 and substrate 910 to the reference potential (e.g., ground).

The shield layer 930 may include at least one of a metalized tape or metalized Mylar®. In some embodiments, the shield layer 930 may include multiple layers (e.g. two or more layers). In an embodiment, one or more of the shield layers 930 may include different materials. In other embodiments, each of the multiple shield layers 930 may include the same materials.

The insulation layer 920 may be applied or coated to a surface of the conductor 940. In some embodiments, such as during a manufacturing process of current sensor 900, the substrate 910 may be mounted or otherwise disposed on the conductor 940. The substrate 910 may be mounted after the shield layer 930 has been applied to the first surface 910a and after the insulation layer 920 has been applied to the first surface of the conductor 940. Thus, the shield layer 930 can be mounted on or otherwise disposed on the insulation layer 920 and make contact with the insulation layer 920.

In some embodiments, an interconnect 960 may electrically couple the second surface 910b to at least one signal lead 945a. For example, a first bond pad 926a can be disposed on the second surface 910b and a second bond pad 926b can be disposed on a first surface of the signal lead 945. The interconnect 960 can be coupled to both the first bond pad 926a and the second bond pad 926b to couple the second surface 910b to the signal lead 945a.

Current sensor 910 may be different from current sensor 800 described above with respect to FIG. 8, in that it includes the conductive epoxy layer 950 and no via. The conductive epoxy layer 950 may be formed on one or more surfaces of the semiconductor substrate 910. For example, in the illustrative embodiment of FIG. 9, the conductive epoxy layer 950 is formed a long the first surface 910a and one side surface 910d. In other embodiment, the conductive epoxy layer 950 may be formed on only one surface or alternatively on two or more surfaces (including side surfaces) of the semiconductor substrate 910.

The conductive epoxy layer 950 may include at least one of a conductive die attach epoxy or a metallized tape. In some embodiments, the interconnect 960 may couple the conductive epoxy layer 950 to at least one signal lead 945a.

Figure 10:
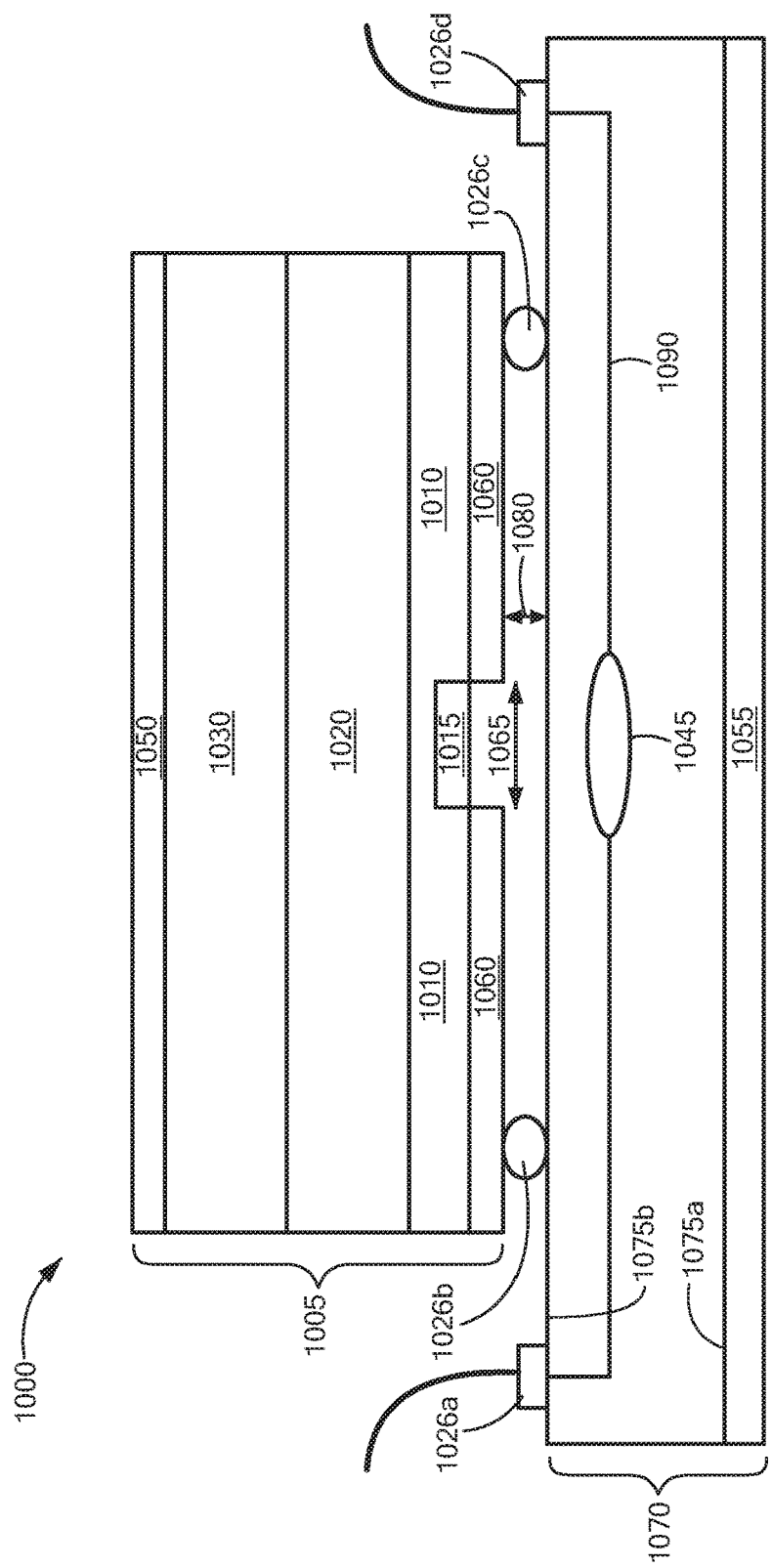
FIG. 10 is a cross section of a current sensor having a flip chip assembly with a coil as a conductor supported by a first die.

Now referring to FIG. 10, a current sensor 1000 includes a first die 1070 having a first surface 1075a and a second opposing surface 1075b supporting a conductor 1045 in the form of a coil and a second die 1005 having a first surface on which a shield layer 1060 is formed and a second opposing surface. In an embodiment, the shield layer 1060 may include a slit 1065 that may be the same as or similar to the slit shown in FIG. 3A. The shield layer 1160 may be spaced from the second surface 1075b of the first die 1070 by an airgap 1080 and the current sensor may include a magnetic field sensing element adjacent to the conductor 1045 and configured as a flip chip.

As illustrated in FIG. 10, the current sensor 1000 includes a first die 1070 and a second die 1005. Thus, the current sensor 1000 may have a dual die or stacked die assembly. In some embodiments, and as will be described in greater detail below, the first die 1070 may be an interposer having a coil 1045 and the second die may be an IC having a magnetic field sensing element 1015.

The first die 1070 may be spaced apart from the second die 1005 by an airgap 1080 in a flip chip configuration. In an embodiment, a plurality of solder balls or other electrical interconnect structure 1026b-1026c may be disposed between respective bond pads 1026a, 1026d on the first die 1070 and on the second die 1005. In some embodiments, the plurality of solder balls 1026b-1026c may be microbumps. The solder balls 1026b-1026c may be disposed along the second surface of the first die 1070. In an embodiment, the space created by airgap 1080 may be filled with an underfill material or an epoxy mold compound material during packaging.

The first die 1070 includes a conductor 1075 having the coil 1045. In an embodiment, the coil 1045 may have thickness that ranges from about 3 μm to about 21 μm. The conductor has a first surface 1075a and a second surface 1075b. In the illustrative embodiment of FIG. 10, the coil 1045 is disposed proximal to the second surface 1075b. A current path 1090 may be formed within the conductor 1075 to couple the coil 1045 to at least two bond pads 1026a, 1026d. For example, in some embodiments, the coil 1045 may be coupled to bond pads 1026a, 1026d.

In some embodiments, the first die 1070 may include a silicon interposer. For example, the conductor 1075 may include a copper redistribution layer (Cu RDL) and the coil 1045 can be disposed within the copper redistribution layer. In an embodiment, coil 1045 may include a single copper or conductive trace.

A shield layer 1055 may be disposed along one surface (here the first surface 1075a) of the conductor 1075. The shield layer 1055 may be applied or otherwise coated on the first surface 1075a. The shield layer 1055 may be provided as a back side die shield (or back side metallization) for the first die 1070. The shield layer 1055 may include copper, aluminum or other conductive metal material.

The second die 1005 includes a first shield layer 1060, a protective layer 1010 disposed along a second surface of the first shield layer 1060, a first semiconductor substrate 1020 disposed along a second surface of the protective layer 1010, a second semiconductor substrate 1030 disposed along a second surface of the first semiconductor substrate 1020 and a second shield layer 1050 disposed along a second surface of the second semiconductor substrate 1030. In some embodiments, contacts to the different layers of second die 1005 can be made through additional solder balls 1026a-1026c and/or wire bonds (not shown) to make an electrical connection to the magnetic field sensor and thus, to magnetic field sensing element 1015.

In an embodiment, the protective layer 1010 may be applied or coated on the second surface of the first shield layer 1060. The first semiconductor substrate 1020 may be applied or disposed on a surface of the protective layer 1010. In other embodiments, the protective layer 1010 may be applied or coated on a surface of the first semiconductor substrate 1020 and the first shield layer 1060 may be applied or coated on a surface of the protective layer 1010.

The second semiconductor substrate 1030 may be applied to a surface of the first semiconductor substrate 1020. The second shield layer 1050 may be applied to or coated on a surface of the second semiconductor substrate 1030.

In some embodiments, the first semiconductor substrate 1020 includes a metallization layer. For example, the first semiconductor substrate 1020 may include a back end of line (BEOL) metallization layer. The second semiconductor substrate 1030 may include a metallization layer. For example, the second semiconductor substrate 1030 may include a front end of line (FEOL) metallization layer. In one embodiment, the second semiconductor substrate 1030 may include an FEOL complementary metal-oxide semiconductor (CMOS) wafer.

The first and second shield layers 1060, 1050 may include copper, aluminum or other conductive metal material. The second shield layer 1050 may be disposed along the second surface of the second semiconductor substrate 1030 as a back side shield layer or back side metallization.

The protective layer 1010 includes a magnetic field sensing element 1015. The magnetic field sensing element 1015 may include a magnetic field sensing circuit and may include at least one of a Hall-effect element or a magnetoresistance element. For example, the magnetoresistance element may include at least one of Indium Antimonide (InSb), a GMR element, an AMR element, a TMR element or a MTJ element. In some embodiments, the magnetic field sensing element 1015 may be positioned such that is it adjacent to or aligned with the coil 1045 in the first die 1070.

The magnetic field sensing element 1015 may be diffused into a surface or otherwise disposed on or supported by a surface of the protective layer 1010. While only one magnetic field sensing element 1015 is shown, it should be appreciated that more than one magnetic field sensing element 1015 may be used in current sensor 1000.

In embodiments, the first shield layer 1060 can be disposed between the protective layer 1010 (having the magnetic field sensing element 1015) and the conductor 1075. The first shield layer 1060 may include a slit 1065 that may be a slot, cut or a cross shaped opening formed in the first shield layer 1060 and that may take the various forms and provide the advantages discussed above in connection with FIG. 3A.

In some embodiments, shield layers (e.g. first shield layer 1060, second shield layer 1050 and third shield layer 1055) may serve to electrically tie one plate of undesirable parasitic capacitance between the conductor 1075 and the first and/or second substrate 1020, 1030 to a reference potential. The shield layers (e.g. first shield layer 1060, second shield layer 1050 and third shield layer 1055) can be disposed along one side of the first die 1070 and one side of the second die 1005. Thus, in some embodiments, the current sensor 1000 may have a shield layer on both ends, the second shield layer 1050 disposed along the second surface of the second die 1005 and the third shield layer 1055 disposed along the first surface of the first die 1070. In some embodiments, this may be referred to as back side die shielding or back side metallization with back side shielding applied to both the first die 1070 (e.g. interposer) and the second die 1105 (e.g. MOS IC).

In some embodiments, the first die 1070 and the second die 1005 may be fabricated separately to protect the circuitry of the second die 1005. For example, by disposing and fabricating the coil 1045 on the first die 1070 and the magnetic field sensing circuit 1015 on the second die 1005, the magnetic field sensing circuit 1015 may be protected from high temperature processing steps, such as during dielectric and/or buffer layer formation.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed:

1. A current sensor comprising:
   a conductor;
   an insulation layer in contact with the conductor;
   a semiconductor substrate having a shield layer disposed on a first surface proximal to the insulation layer and a second opposing surface distal from the insulation layer, wherein the shield layer is disposed between the substrate and the insulation layer;
   a magnetic field sensing circuit, comprising a magnetic field sensing element, supported by the semiconductor substrate; and
   a via extending through the semiconductor substrate to couple the shield layer to the second surface of the semiconductor substrate, wherein the shield layer is coupled to a reference potential;
   wherein the shield layer is coupled to the reference potential through the via, wherein the magnetic filed sensing circuit is supported by the second surface of the semiconductor substrate and wherein the reference potential to which the shield layer is couples is a reference potential of the magnetic field sensing circuit.

2. The current sensor of claim 1, wherein the current sensor is provided in the form of an integrated circuit having a lead frame, wherein the conductor comprises a first portion of the lead frame and a plurality of signal leads comprise a second portion of the lead frame.

3. The current sensor of claim 2, further comprising an interconnect configured to couple the via to at least one of the plurality of signal leads.

4. The current sensor of claim 3, wherein the interconnect comprises a wire bond.

5. The current sensor of claim 1, wherein the magnetic field sensing element comprises at least one of a Hall-effect element or a magnetoresistance element.

6. The current sensor of claim 5, wherein the magnetoresistance element includes at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element.

7. The current sensor of claim 1, wherein the insulation layer comprises at least one of a polymer dielectric material or a layer of adhesive.

8. The current sensor of claim 1, wherein the shield layer comprises a conductive material.

9. The current sensor of claim 8, wherein the conductive material comprises one or more of copper, aluminum, gold, nickel and aluminum copper alloy.

10. The current sensor of claim 1, wherein the via comprises a through-silicon via extending from the first surface of the semiconductor substrate to the second surface of the semiconductor substrate.

11. The current sensor of claim 1, wherein the first surface of the semiconductor substrate supports the magnetic field sensing circuit.

12. The current sensor of claim 11, wherein the magnetic field sensing circuit comprises a magnetic field sensing element comprising at least one of a Hall-effect element or a magnetoresistance element.

13. The current sensor of claim 12, wherein the magnetoresistance element includes at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element.

14. The current sensor of claim 1, wherein the shield layer comprises a slot aligned with the magnetic field sensing element.

15. The current sensor of claim 14, wherein the slot reduces a property of an eddy current as sensed by the magnetic field sensing element.

16. The current sensor of claim 2, wherein the magnetic field sensing circuit is supported by the second surface of the semiconductor substrate and wherein the current sensor further comprises an interconnect configured to couple the second surface of the semiconductor substrate to at least one of the plurality of signal leads.

17. The current sensor of claim 16, wherein the interconnect comprises a wire bond.

18. The current sensor of claim 1, wherein the insulation layer extends beyond a length of the conductor.

19. The current sensor of claim 1, wherein the insulation layer is formed by one or both of a taping process or a deposition process.

* * * * *

UNITED STATES PATENT AND TRADEMARK OFFICE
CERTIFICATE OF CORRECTION

PATENT NO. : 10,352,969 B2
APPLICATION NO. : 15/363285
DATED : July 16, 2019
INVENTOR(S) : Shaun Milano et al.

It is certified that error appears in the above-identified patent and that said Letters Patent is hereby corrected as shown below:

In the Specification

Column 8, Line 46 delete "potential, as mat be" and replace with --potential, as may be--.

Column 17, Line 35 delete "surface 610 b to" and replace with --surface 610b to--.

Column 21, Line 20 delete "disposed long" and replace with --disposed along--.

Column 22, Line 16 delete "may be sued to" and replace with --may be used to--.

Column 23, Line 60 delete "In other embodiment," and replace with --In other embodiments,--.

In the Claims

Column 26, Line 39 Claim 1 delete "the magnetic filed" and replace with --the magnetic field--.

Column 26, Line 42 Claim 1 delete "layer is couples" and replace with --layer is coupled--.

Signed and Sealed this
Eighth Day of September, 2020

Andrei Iancu
*Director of the United States Patent and Trademark Office*